US012598896B2

(12) United States Patent
Kim et al.

(10) Patent No.: US 12,598,896 B2
(45) Date of Patent: Apr. 7, 2026

(54) DISPLAY DEVICE AND METHOD FOR MANUFACTURING THEREOF

(71) Applicant: Samsung Display Co., LTD., Yongin-si (KR)

(72) Inventors: Wan Jung Kim, Yongin-si (KR); Dae Sang Yun, Yongin-si (KR); Kyung Ah Nam, Yongin-si (KR); Hyo Young Mun, Yongin-si (KR); Yong Seung Park, Yongin-si (KR); Yi Seul Um, Yongin-si (KR); So Young Lee, Yongin-si (KR); Young Hoon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 400 days.

(21) Appl. No.: 18/314,615

(22) Filed: May 9, 2023

(65) Prior Publication Data

US 2024/0099105 A1     Mar. 21, 2024

(30) Foreign Application Priority Data

Sep. 16, 2022     (KR) ........................ 10-2022-0117421

(51) Int. Cl.
*H10K 59/80* (2023.01)
*H10K 59/12* (2023.01)
(52) U.S. Cl.
CPC ....... *H10K 59/873* (2023.02); *H10K 59/1201* (2023.02)

(58) Field of Classification Search
CPC ............. H10K 59/873; H10K 59/1201; H10K 59/871; H10K 77/10; H10K 71/851; H10K 50/844; H10K 50/8426; H10K 71/00
See application file for complete search history.

(56) References Cited

U.S. PATENT DOCUMENTS 11,205,769 B2    12/2021 Lee et al.
12,315,437 B2 *   5/2025 Kim ..................... H10K 71/851
(Continued)

FOREIGN PATENT DOCUMENTS

KR    10-2020-0005834 A    1/2020
KR    10-2020-0145881 A    12/2020
(Continued)

*Primary Examiner* — J.E. Schoenholtz
(74) *Attorney, Agent, or Firm* — Womble Bond Dickinson (US) LLP

(57) ABSTRACT

A display device and method for manufacturing thereof are provided. The display device includes a substrate having a display area and a non-display area, and including an edge, an upper surface having an edge area in which a processing trace remains adjacent to the edge, a bottom surface opposite to the upper surface, a side surface connected to the upper surface and not parallel thereto, and a first inclined surface connected to the side surface and to the bottom surface, a light-emitting element layer above the upper surface of the substrate in the display area, and including light-emitting elements, an encapsulating layer above the light-emitting element layer and corresponding to a portion of the display area and the non-display area, and a protective layer above an outer surface of the substrate, and located on at least one of the bottom surface, the side surface, or the first inclined surface.

20 Claims, 34 Drawing Sheets

(56)                    References Cited

U.S. PATENT DOCUMENTS

| | | | |
|---|---|---|---|
| 2019/0067630 A1* | 2/2019 | Hwang | .................. H10K 59/12 |
| 2020/0152909 A1* | 5/2020 | Hwang | .............. H10K 59/8722 |
| 2020/0295297 A1* | 9/2020 | Jo | ........................ H10K 77/111 |
| 2021/0028391 A1 | 1/2021 | Yug et al. | |
| 2021/0036267 A1* | 2/2021 | Yug | ........................ H10K 71/80 |
| 2021/0202906 A1 | 7/2021 | Kim et al. | |
| 2022/0045288 A1 | 2/2022 | Paek et al. | |
| 2023/0209885 A1* | 6/2023 | Paek | .................. H10K 59/8792 |
| | | | 359/483.01 |
| 2023/0217703 A1* | 7/2023 | Lee | ........................ H10K 59/87 |
| | | | 257/680 |
| 2024/0040830 A1 | 2/2024 | Yun et al. | |

FOREIGN PATENT DOCUMENTS

| | | | |
|---|---|---|---|
| KR | 10-2022-0082964 A | 6/2022 | |
| KR | 20230160664 A | 11/2023 | |
| KR | 20240015219 A | 2/2024 | |
| WO | WO 2013/161785 A1 | 10/2023 | |

* cited by examiner

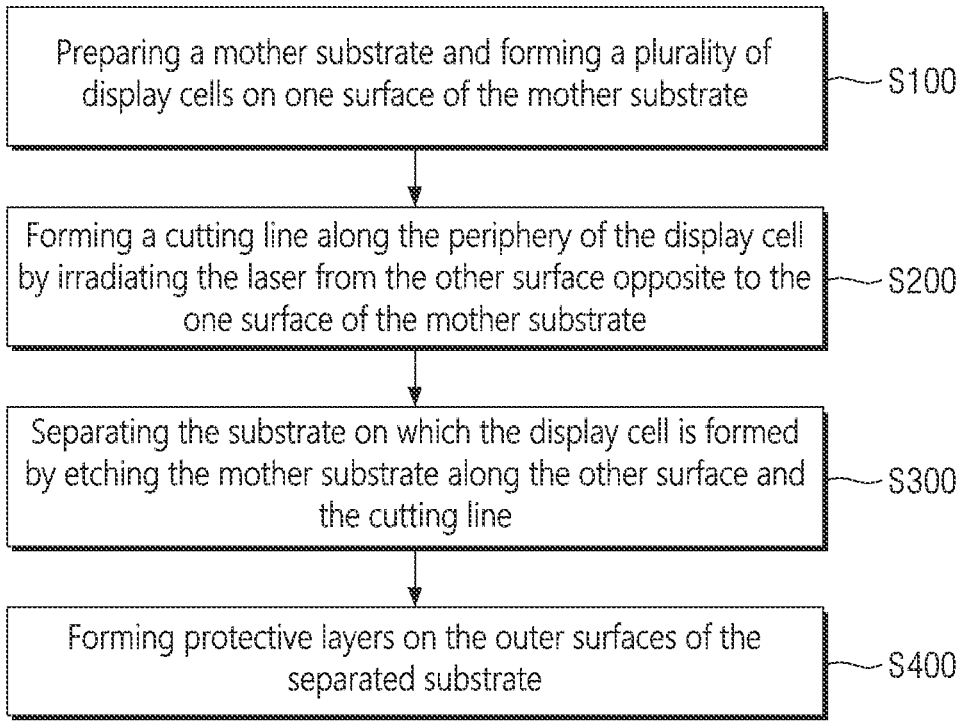

Preparing a mother substrate and forming a plurality of display cells on one surface of the mother substrate ——S100

Forming a cutting line along the periphery of the display cell by irradiating the laser from the other surface opposite to the one surface of the mother substrate ——S200

Separating the substrate on which the display cell is formed by etching the mother substrate along the other surface and the cutting line ——S300

Forming protective layers on the outer surfaces of the separated substrate ——S400

FIG. 22
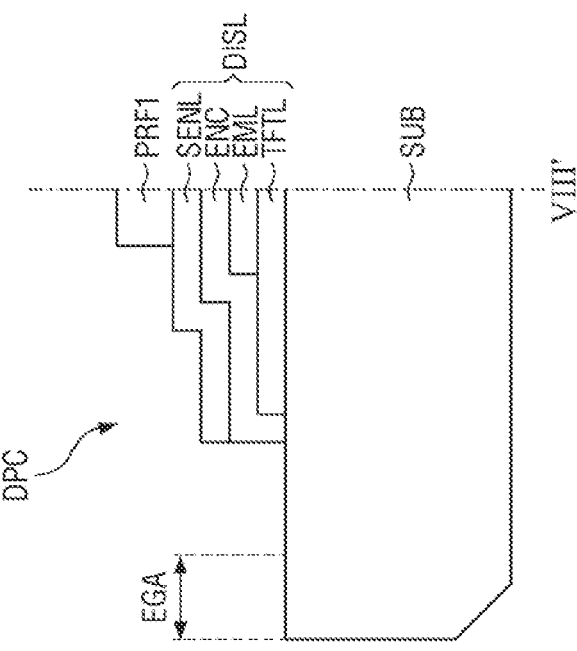
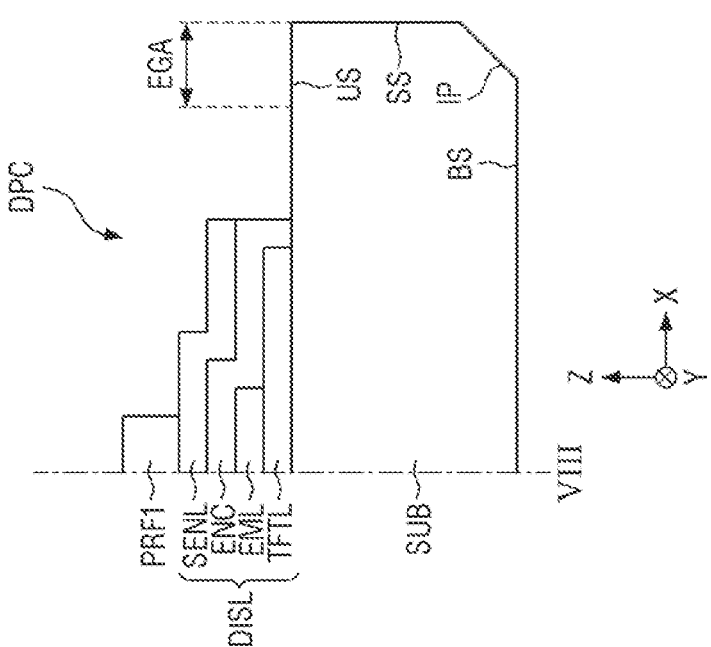

FIG. 34

DISPLAY DEVICE AND METHOD FOR MANUFACTURING THEREOF

CROSS-REFERENCE TO RELATED APPLICATION

This application claims priority to, and the benefit of, Korean Patent Application No. 10-2022-0117421 filed on Sep. 16, 2022, in the Korean Intellectual Property Office, the contents of which in its entirety are herein incorporated by reference.

BACKGROUND

1. Field

The present disclosure relates to a display device and a method for manufacturing thereof.

2. Description of the Related Art

As the information society develops, the demand for a display device for displaying an image is increasing in various forms. For example, the display device is applied to various electronic devices, such as a smart phone, a digital camera, a notebook computer, a navigation system, and a smart television. The display device may be a flat panel display device, such as a liquid crystal display device, a field emission display device, or an organic light-emitting display device. Among the flat panel display devices, the light-emitting display device includes a light-emitting element in which each pixel of the display panel may emit light by itself, so that an image may be displayed without a backlight unit providing light to the display panel.

The display device includes a display area for displaying an image and a periphery of the display area, for example, a non-display area arranged to surround the display area. Recently, the width of the non-display area is gradually decreasing to increase immersion in the display area and increase the aesthetics of the display device.

Meanwhile, the display device may be formed by cutting a mother substrate along a plurality of display cells formed on the mother substrate including the plurality of display cells in a manufacturing process of the display device.

The non-display area may include a first non-display area in which lines and circuits for driving the display area are located, and a second non-display area corresponding to a margin for a cutting process in the manufacturing process. Because there is a limit to reducing lines and circuits in the first non-display area, a method for reducing the width of the second non-display area is being studied.

Aspects of embodiments of the present disclosure provide a display device capable of reducing or minimizing a width of a non-display area and a method of manufacturing the same.

Aspects of embodiments of the present disclosure provide a display device capable of improving mechanical strength of the display device and a method of manufacturing the same.

Aspects of embodiments of the present disclosure provide a display device capable of cutting the substrate while reducing the thickness of the substrate and a method of manufacturing the same.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the disclosure, a display device includes a substrate having a display area, and a non-display area surrounding the display area, and including an edge, an upper surface having an edge area in which a processing trace remains adjacent to the edge, a bottom surface opposite to the upper surface, a side surface connected to the upper surface and not parallel thereto, and a first inclined surface connected to the side surface and to the bottom surface and not parallel thereto, a light-emitting element layer above the upper surface of the substrate in the display area, and including light-emitting elements, an encapsulating layer above the light-emitting element layer and corresponding to a portion of the display area and the non-display area, and a protective layer above an outer surface of the substrate, and located on at least one of the bottom surface, the side surface, or the first inclined surface.

The protective layer may include inorganic polysilazane or organic polysilazane.

The protective layer may include a first protective layer on the bottom surface of the substrate, and a second protective layer on the first inclined surface of the substrate.

The protective layer may further include a third protective layer on the side surface of the substrate.

The second protective layer may extend to the side surface of the substrate.

A portion of the second protective layer may be above the upper surface of the substrate to cover the edge area.

The display device may further include an encapsulating substrate above the encapsulating layer, wherein the protective layer covers the side surface of the substrate and a side surface of the encapsulating substrate.

The display device may further include a sealing material between the encapsulating substrate and the substrate.

The display device may further include a crack dam in the non-display area above the substrate, and surrounding the display area.

The encapsulating layer may cover the crack dam, and extends to the edge area of the substrate, wherein a distance between the crack dam and the edge is about 130 µm or less.

The display device may further include a first dam in the non-display area and surrounding the light-emitting element layer in plan view, and a second dam surrounding the first dam in plan view, and located closer to the edge of the substrate than the first dam, wherein the encapsulating layer covers the first dam and the second dam, and wherein a portion of the encapsulating layer is between the second dam and the edge of the substrate.

A distance between the edge of the substrate and the encapsulating layer may be about 300 µm or less.

The first inclined surface may overlap the edge area in a thickness direction, wherein a width of the edge area is about 50 µm.

An angle between the upper surface and the side surface of the substrate may be about 90°, wherein an angle between the side surface and the first inclined surface, and an angle between the first inclined surface and the bottom surface are respective obtuse angles.

According to one or more embodiments of the disclosure, a method for manufacturing a display device includes preparing a mother substrate, forming display cells above one surface of the mother substrate, forming a cutting line along a periphery of the display cell, and forming a processing mark on the one surface of the mother substrate, by irradiating a laser from another surface of the mother substrate that is opposite to the one surface of the mother substrate, separating a substrate on which the display cells are formed by etching the mother substrate along the cutting line, and forming a protective layer on at least one of a bottom surface of the separated substrate, a side surface of the separated substrate, or a first inclined surface of the separated substrate that is connected to, and not parallel to, the bottom surface and the side surface, the protective layer including inorganic polysilazane or organic polysilazane.

Forming the protective layer may include spraying an uncured silazane material onto the bottom surface, the side surface, and the first inclined surface of the substrate, and curing the silazane material.

Forming the protective layer may include stacking one or more of substrates, and applying the silazane material on at least one of the side surface and the first inclined surface.

The laser may be irradiated from the one surface of the mother substrate to a first depth of about 50 μm to about 500 μm.

Etching the mother substrate may include reducing a thickness of the mother substrate by isotropically etching the other surface of the mother substrate, and separating the substrate by anisotropically etching the cut line and areas other than the cut line irradiated with the laser on the mother substrate.

The first inclined surface may overlap an edge area on which the processing mark is formed in a thickness direction, wherein a width of the edge area is about 50 μm.

The display device according to one or more embodiments may have resistance to external impact while reducing or minimizing an area that unnecessarily occupies an outer part of the display panel.

The method of manufacturing a display device according to one or more embodiments may improve the efficiency of a manufacturing process including a laser-irradiating process and an etching process, and may improve resistance to external impact even when the above processes are performed.

The aspects of the present disclosure are not limited to the aforementioned aspects, and various other aspects are included in the present specification.

BRIEF DESCRIPTION OF THE DRAWINGS

FIG. 10 is a cross-sectional view illustrating area C of FIG. 8 in more detail.

FIG. 11 is a cross-sectional view illustrating another example of area C of FIG. 8 in more detail.

FIG. 12 is a cross-sectional view illustrating an area D of FIG. 9 in more detail.

FIG. 13 is a flowchart illustrating a manufacturing process of a display device according to one or more embodiments.

Figure 18:
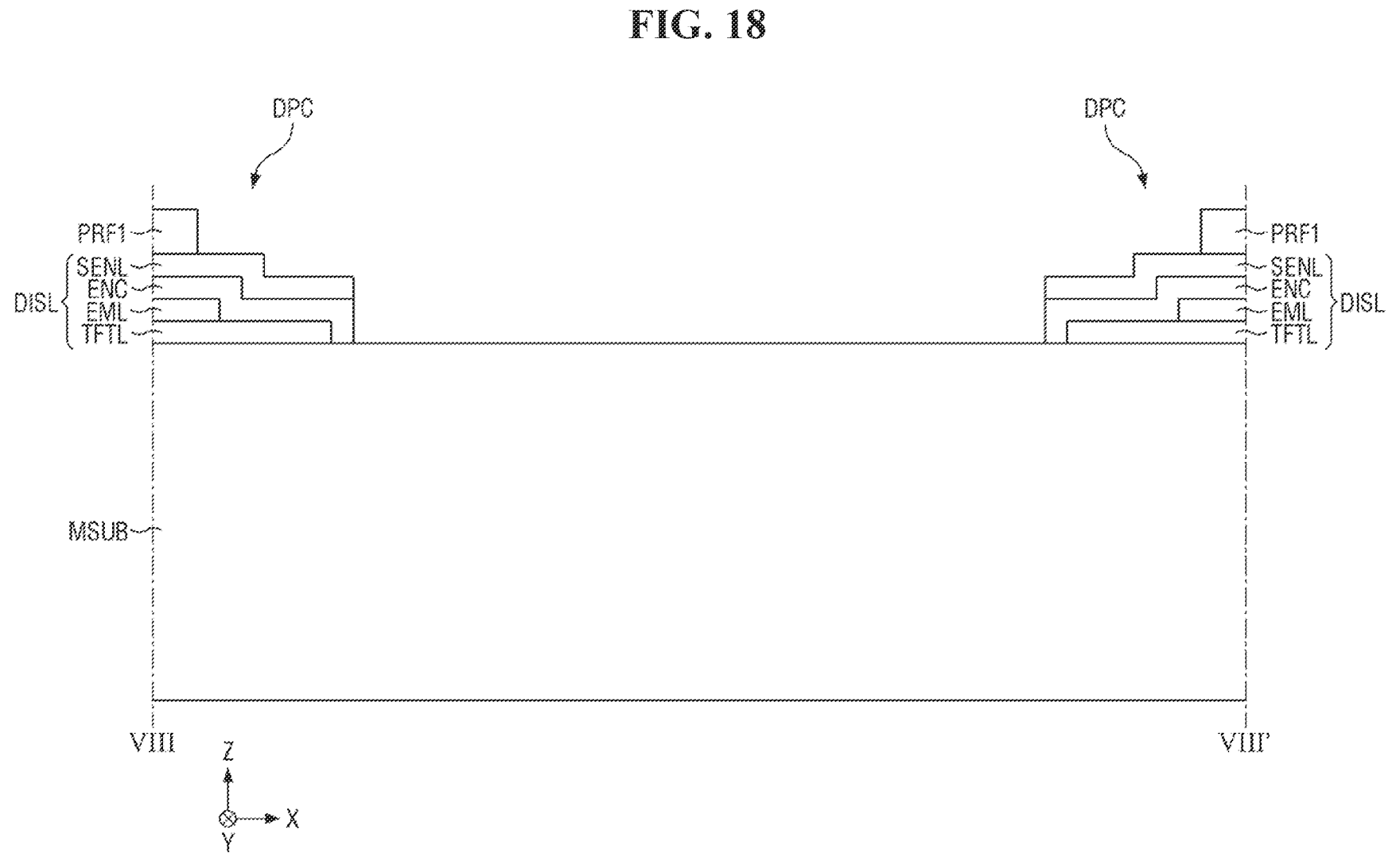

FIGS. 14 to 18 are perspective and cross-sectional views sequentially illustrating a part of a manufacturing process of a display device according to one or more embodiments.

FIGS. 19 to 22 are cross-sectional views sequentially illustrating a part of a manufacturing process of a display device according to one or more embodiments.

FIG. 34 is a cross-sectional view illustrating area E of FIG. 33 in more detail.

DETAILED DESCRIPTION

Figure 1:
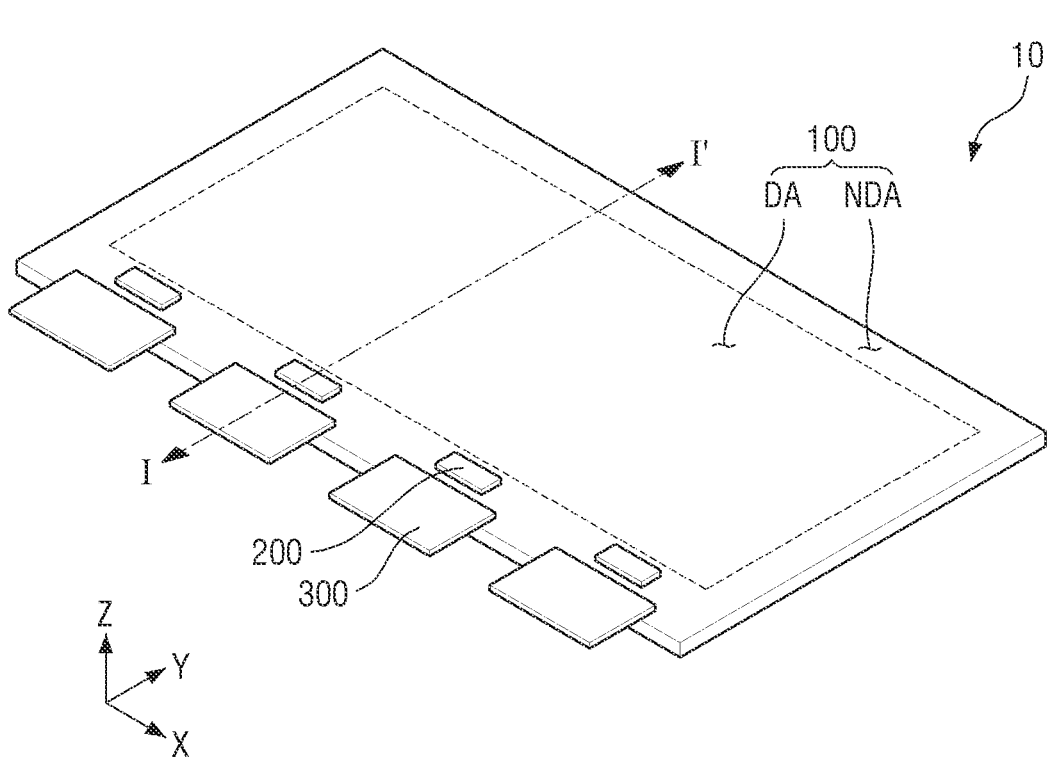
FIG. 1 is a schematic perspective view of a display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments will be described with reference to the accompanying drawings.

Figure 2:
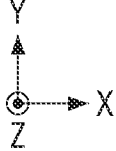
FIG. 2 is a plan view illustrating a display panel according to one or more embodiments.

FIG. 1 is a perspective view illustrating a display device according to one or more embodiments. FIG. 2 is a plan view illustrating a display panel according to one or more embodiments.

Referring to FIGS. 1 and 2, a display device 10 is a device for displaying a moving image or a still image. The display device may be used as a display screen of various products, such as televisions, laptop computers, monitors, billboards and the Internet of Things (IOT) as well as portable electronic devices, such as mobile phones, smart phones, tablet personal computer (tablet PC), smart watches, watch phones, mobile communication terminals, electronic notebooks, electronic books, portable multimedia players (PMP), navigation systems and ultra mobile PCs (UMPC).

The display device 10 according to one or more embodiments may be a light-emitting display device, such as an organic light-emitting display device using an organic light-emitting diode, a quantum dot light-emitting display including a quantum dot light-emitting layer, an inorganic light-emitting display device including an inorganic semiconductor, and a micro light-emitting display device using a micro or nano light-emitting diode (micro LED or nano LED). Hereinafter, the display device 10 has been mainly described as an organic light-emitting display device, but the present disclosure is not limited thereto.

The display device 10 according to one or more embodiments includes a display panel 100, a driving integrated circuit (IC) 200, and a circuit board 300.

The display panel 100 may be formed in a rectangular plane having a long side in a first direction (X-axis direction), and a short side in a second direction (Y-axis direction) intersecting the first direction (X-axis direction). A corner where the long side of the first direction (X-axis direction) and the short side of the second direction (Y-axis direction) meet may be formed at a right angle, or may be rounded to have a curvature. The flat shape of the display panel 100 is not limited to a quadrangle, and may be formed in other polygons, circles, or ovals.

The display panel 100 may be formed to be flat, but is not limited thereto. For example, the display panel 100 is formed at left and right ends, and may include curved parts having a constant curvature or a varying curvature. In addition, the display panel 100 may be flexibly formed to be bent, folded, or rolled.

The display panel 100 may include a display area DA for displaying an image, and a non-display area NDA around the display area DA.

The display area DA may occupy most of the area of the display panel 100. The display area DA may be located in the center of the display panel 100. Pixels each including a plurality of emission areas may be located in the display area DA to display an image.

The non-display area NDA may be located adjacent to the display area DA. The non-display area NDA may be an area outside the display area DA. The non-display area NDA may surround the display area DA. The non-display area NDA may be an edge area of the display panel 100.

Display pads PD may be located in the non-display area NDA to be connected to the circuit boards 300. The display pads PD may be located on one edge of the display panel 100. For example, the display pads PD may be located on the bottom edge of the display panel 100.

The driving integrated circuits IC 200 may generate data voltages, power supply voltages, scan timing signals, and the like. The driving ICs 200 may output data voltages, power supply voltages, scan timing signals, and the like.

The driving IC 200 may be located between the display pads PD and the display area DA in the non-display area NDA. Each of the driving ICs 200 may be attached to the non-display area NDA of the display panel 100 in a chip-on-glass (COG) method. Alternatively, each of the driving ICs 200 may be attached to the circuit board 300 using a chip-on-plastic (COP) method.

The circuit boards 300 may be located on the display pads DP located on one edge of the display panel 100. The circuit boards 300 may be attached to the display pads PD using an anisotropic conductive film and a conductive adhesive member, such as an anisotropic conductive adhesive. Accordingly, the circuit boards 300 may be electrically connected to signal lines of the display panel 100. The circuit boards 300 may be a flexible film, such as a flexible printed circuit board or a chip on film.

Figure 3:
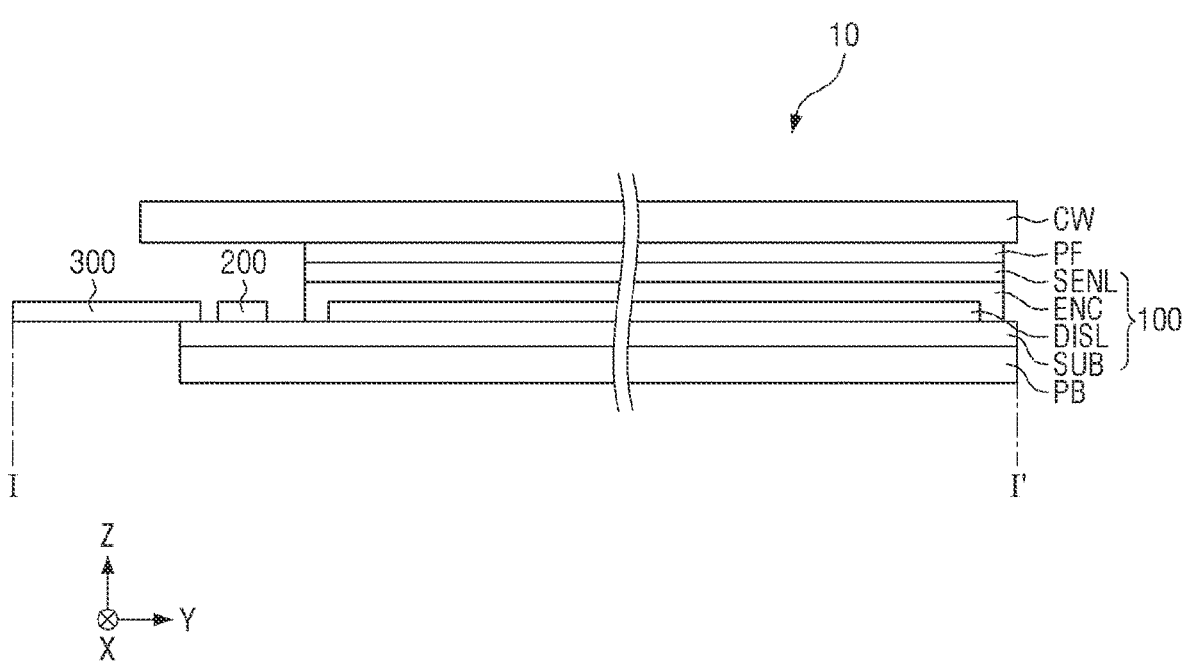
FIG. 3 is a cross-sectional view illustrating a display device taken along the line I-I' of FIG. 1, according to one or more embodiments.
Figure 4:
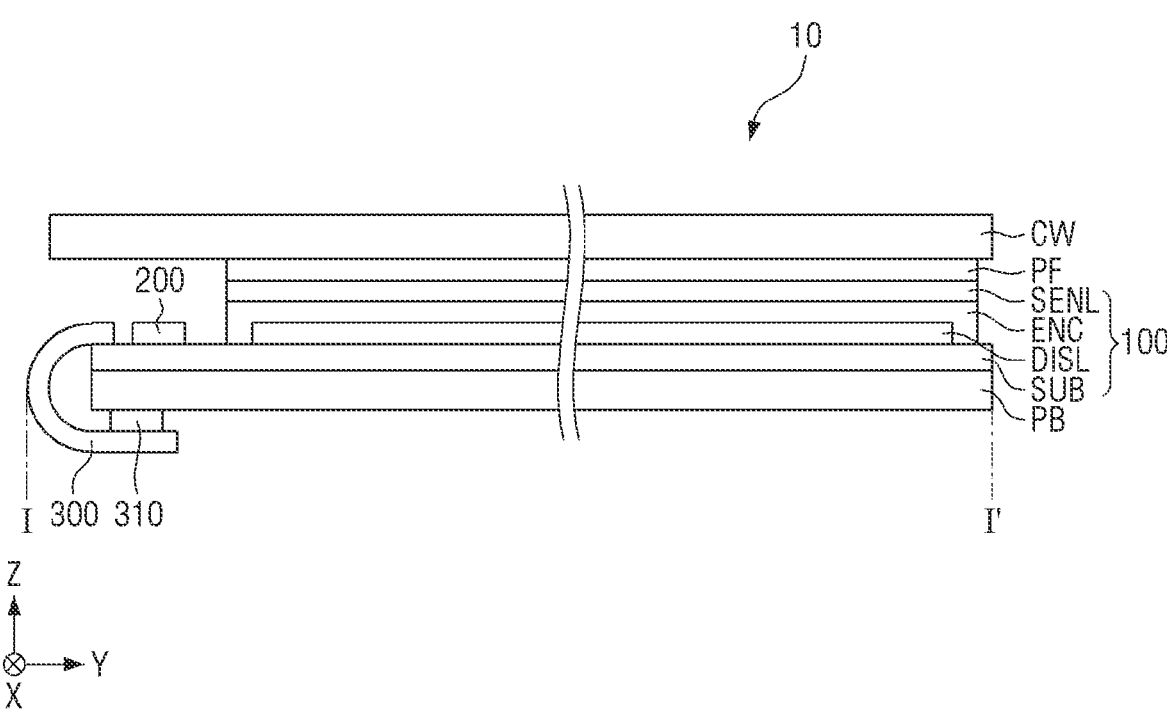
FIG. 4 is a cross-sectional view illustrating a display device in which the circuit board is bent in FIG. 3, according to one or more embodiments.

FIG. 3 is a cross-sectional view illustrating a display device taken along the line I-I' of FIG. 1, according to one or more embodiments. FIG. 4 is a cross-sectional view illustrating a display device in which the circuit board is bent in FIG. 3, according to one or more embodiments.

Referring to FIGS. 3 and 4, the display device 10 according to one or more embodiments may include the display panel 100, a polarizing film PF, a cover window CW, and a panel bottom cover PB. The display panel 100 may include the substrate SUB, a display layer DISL, an encapsulating layer ENC, and a sensor electrode layer SENL.

The substrate SUB may be formed of glass.

The display layer DISL may be located on the first surface of the substrate SUB. The display layer DISL may be a layer that displays an image. The display layer DISL may include a thin film transistor layer TFTL in which thin film transistors are formed and a light-emitting element layer EML in which light-emitting elements that emit light are located in the light-emitting areas.

In the display area DA of the display layer DISL, scan lines, data lines, power lines, etc. for the emission areas to emit light may be located. In the non-display area NDA of the display layer DISL, a scan driving circuit unit for outputting scan signals to the scan lines, and fan-out lines connecting the data lines and the driving IC 200 may be located.

The encapsulating layer ENC may be a layer for encapsulating the light-emitting element layer EML of the display layer DISL to reduce or prevent oxygen or moisture from penetrating into the light-emitting element layer EML of the display layer DISL. The encapsulating layer ENC may be located on the display layer DISL. The encapsulating layer ENC may be located on the upper surface and side surfaces of the display layer DISL. The encapsulating layer ENC may cover the display layer DISL.

The sensor electrode layer SENL may be located on the display layer DISL. The sensor electrode layer SENL may include sensor electrodes. The sensor electrode layer SENL may sense a user's touch using sensor electrodes.

The polarizing film PF may be located on the display panel 100 to reduce reflection of external light. The polarizing film PF may include a first base member, a linear polarizing plate, a phase delay film, such as a λ/4 plate (quarter-wave plate), and a second base member. The first base member, the phase delay film, the linear polarizing plate, and the second base member of the polarizing film PF may be sequentially stacked on the display panel 100.

The cover window CW may be located on the polarizing film PF. The cover window CW may be attached to the polarizing film PF by a transparent adhesive member, such as an optically clear adhesive (OCA) film.

The panel bottom cover PB may be located on the second surface of the substrate SUB of the display panel 100. The second surface of the substrate SUB may be opposite to the first surface. The panel bottom cover PB may be attached to the second surface of the substrate SUB of the display panel 100 through the adhesive member. The adhesive member may be a pressure sensitive adhesive (PSA).

The panel bottom cover PB may include at least one of a light-blocking member for absorbing light incident from the outside, a buffer member for absorbing an impact from the outside, and a heat dissipation member for efficiently dissipating heat of the display panel 100.

The light-blocking member may be located under the display panel 100. The light-blocking member blocks light transmission to reduce or prevent visibility of components located under the light-blocking member, for example, the circuit board 300, as viewed from above the display panel 100. The light-blocking member may include a light-absorbing material, such as a black pigment or a black dye.

The buffer member may be located under the light-blocking member. The buffer member absorbs an external shock to reduce or prevent damage to the display panel 100. The buffer member may be formed of a single layer or a plurality of layers. For example, the buffer member is formed of a polymer resin, such as polyurethane, polycarbonate, polypropylene, polyethylene, or the like, or may include a material having elasticity, such as rubber, a urethane-based material, or a sponge formed by foam molding an acrylic-based material.

The heat dissipation member may be located under the buffer member. The heat dissipation member may include a first heat dissipation layer including graphite or carbon nanotubes, and a second heat dissipation layer formed of a thin metal film, such as copper, nickel, ferrite, or silver, which may shield electromagnetic waves and has excellent thermal conductivity.

The circuit board 300 may be bent downward of the display panel 100 as shown in FIG. 4. The circuit board 300 may be attached to the bottom surface of the panel bottom cover PB by an adhesive member 310. The adhesive member 310 may be a pressure-sensitive adhesive.

Figure 5:
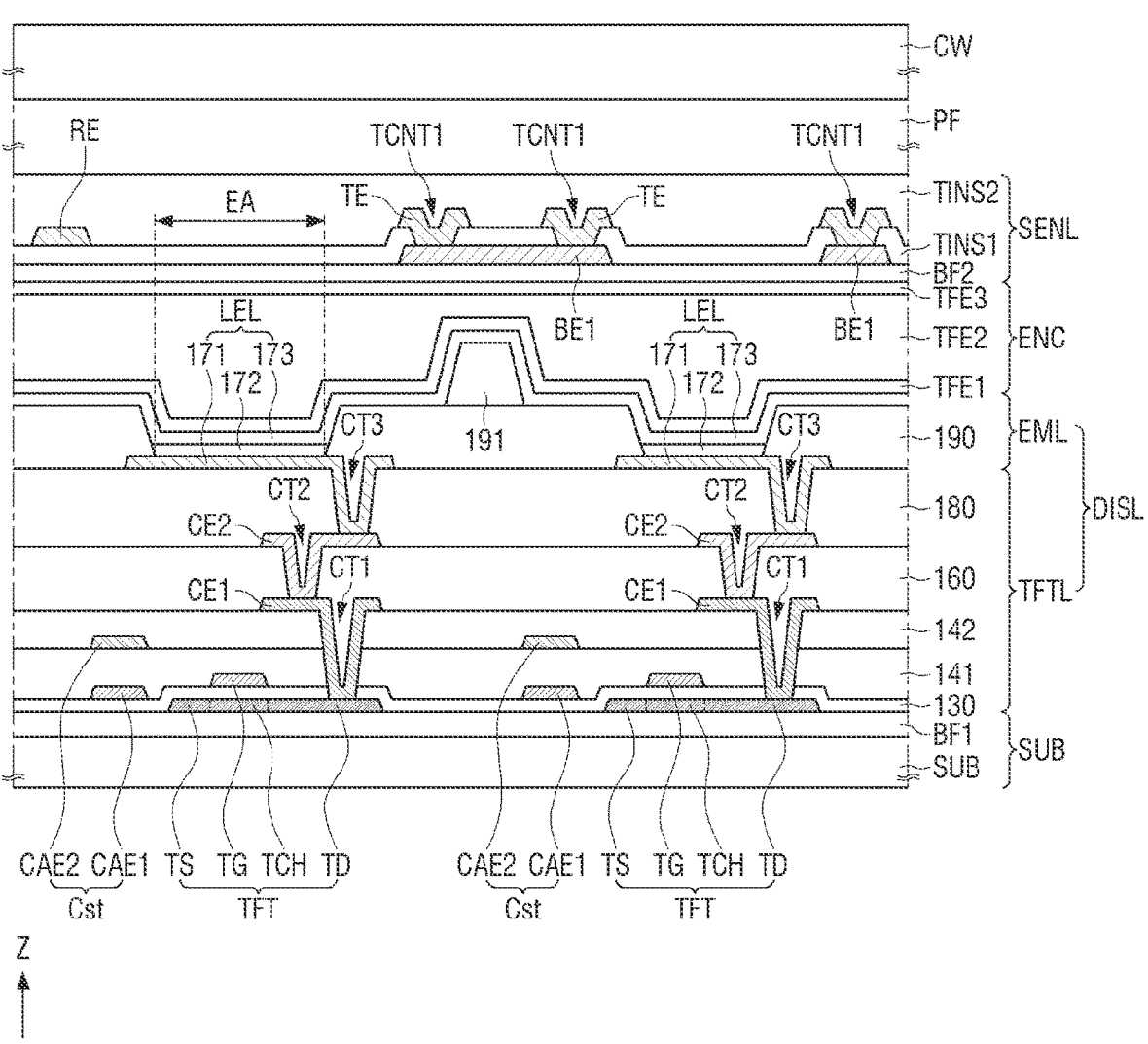
FIG. 5 is a cross-sectional view illustrating a display area of a display panel, according to one or more embodiments.

FIG. 5 is a cross-sectional view illustrating a display area of a display panel, according to one or more embodiments.

Referring to FIG. 5, the display panel 100 according to one or more embodiments may be an organic light-emitting display panel including a light-emitting element LEL including an organic light-emitting layer 172.

The display layer DISL may include a thin film transistor layer TFTL including a plurality of thin film transistors and a light-emitting element layer EML including a plurality of light-emitting elements.

A first buffer layer BF1 may be located on the substrate SUB. The first buffer layer BF1 may be formed of an inorganic material, such as a silicon nitride layer, a silicon oxynitride layer, a silicon oxide layer, a titanium oxide layer, and an aluminum oxide layer. Alternatively, the first buffer layer BF1 may be formed as a multilayer in which a plurality of layers of a silicon nitride layer, a silicon oxynitride layer, a silicon oxide layer, a titanium oxide layer, and an aluminum oxide layer are alternately stacked.

An active layer including a channel area TCH, a source area TS, and a drain area TD of a thin film transistor TFT may be located on the first buffer layer BF1. The active layer may be formed of polycrystalline silicon, single crystal silicon, low temperature polycrystalline silicon, amorphous silicon, or an oxide semiconductor material. When the active layer includes polycrystalline silicon or an oxide semiconductor material, the source area TS and the drain area TD in the active layer may be conductive areas doped with ions or impurities to have conductivity.

A gate insulating layer 130 may be located on the active layer of the thin film transistor TFT. The gate insulating layer 130 may be formed of an inorganic layer, for example, a silicon nitride layer, a silicon oxynitride layer, a silicon oxide layer, a titanium oxide layer, or an aluminum oxide layer.

A first gate metal layer including a gate electrode TG of the thin film transistor TFT, a first capacitor electrode CAE1 of the capacitor Cst, and scan lines may be located on the gate insulating layer 130. The gate electrode TG of the thin film transistor TFT may overlap the channel area TCH in the third direction (Z-axis direction). The first gate metal layer may be formed of a single layer or of multiple layers made of any one of molybdenum (Mo), aluminum (Al), chromium (Cr), gold (Au), titanium (Ti), nickel (Ni), neodymium (Nd), and/or copper (Cu), or an alloy thereof.

A first interlayer insulating layer 141 may be located on the first gate metal layer. The first interlayer insulating layer 141 may be formed of an inorganic layer, for example, a silicon nitride layer, a silicon oxynitride layer, a silicon oxide layer, a titanium oxide layer, or an aluminum oxide layer. The first interlayer insulating layer 141 may include a plurality of inorganic layers.

A second gate metal layer including a second capacitor electrode CAE2 of the capacitor Cst may be located on the first interlayer insulating layer 141. The second capacitor electrode CAE2 may overlap the first capacitor electrode CAE1 in the third direction (Z-axis direction). Therefore, the capacitor Cst may be formed by the first capacitor electrode CAE1, the second capacitor electrode CAE2, and an inorganic insulating dielectric layer located therebetween and serving as a dielectric layer. The second gate metal layer may be formed of a single layer or of multiple layers made of any one of molybdenum (Mo), aluminum (Al), chromium (Cr), gold (Au), titanium (Ti), nickel (Ni), neodymium (Nd), and/or copper (Cu), or an alloy thereof.

A second interlayer insulating layer 142 may be located on the second gate metal layer. The second interlayer insulating layer 142 may be formed of an inorganic layer, for example, a silicon nitride layer, a silicon oxynitride layer, a silicon oxide layer, a titanium oxide layer, or an aluminum oxide layer. The second interlayer insulating layer 142 may include a plurality of inorganic layers.

A first data metal layer including a first connection electrode CE1 and data lines may be located on the second interlayer insulating layer 142. The first connection electrode CE1 may be connected to the drain area TD through a first contact hole CT1 penetrating the gate insulating layer 130, the first interlayer insulating layer 141, and the second interlayer insulating layer 142. The first data metal layer may be formed of a single layer or of multiple layers made of any one of molybdenum (Mo), aluminum (Al), chromium (Cr), gold (Au), titanium (Ti), nickel (Ni), neodymium (Nd), and/or copper (Cu), or an alloy thereof.

A first organic layer 160 for flattening a step difference due to a thin film transistors TFT may be located on the first connection electrode CE1. The first organic layer 160 may be formed of an organic layer, such as acryl resin, epoxy resin, phenolic resin, polyamide resin, polyimide resin, etc.

A second data metal layer including a second connection electrode CE2 may be located on the first organic layer 160. The second data metal layer may be connected to the first connection electrode CE1 through a second contact hole CT2 penetrating the first organic layer 160. The second data metal layer may be formed of a single layer or of multiple layers made of any one of molybdenum (Mo), aluminum (Al), chromium (Cr), gold (Au), titanium (Ti), nickel (Ni), neodymium (Nd), and/or copper (Cu), or an alloy thereof.

A second organic layer 180 may be located on the second connection electrode CE2. The second organic layer 180 may be formed of an organic layer, such as acryl resin, epoxy resin, phenolic resin, polyamide resin, polyimide resin, etc. Meanwhile, the second data metal layer and the second organic layer 180 including the second connection electrode CE2 may be omitted in one or more other embodiments.

The light-emitting element layer EML is located on the thin film transistor layer TFTL. The light-emitting element layer EML may include light-emitting elements LEL and a bank 190. Each of the light-emitting elements LEL may include a pixel electrode 171, a light-emitting layer 172, and a common electrode 173. Each of the emission areas EA represents an emission area where holes from the pixel electrode 171 and electrons from the common electrode 173 are combined with each other in the light-emitting layer 172 to emit light by sequentially stacking the pixel electrode 171, the light-emitting layer 172, and the common electrode 173. In this case, the pixel electrode 171 may be an anode electrode, and the common electrode 173 may be a cathode electrode.

A pixel electrode layer including the pixel electrode 171 may be formed on the second organic layer 180. The pixel electrode 171 may be connected to the second connection electrode CE2 through a third contact hole CT3 penetrating the second organic layer 180. The pixel electrode layer may be formed of a single layer or of multiple layers made of any one of molybdenum (Mo), aluminum (Al), chromium (Cr), gold (Au), titanium (Ti), nickel (Ni), neodymium (Nd), and/or copper (Cu), or an alloy thereof.

In a top emission structure that emits light in the direction of the common electrode 173 based on the light-emitting layer 172, the pixel electrode 171 may be formed of a single layer of molybdenum (Mo), titanium (Ti), copper (Cu), or aluminum (Al) or a stacked structure of aluminum and titanium (Ti/Al/Ti), a stacked structure of aluminum and ITO (ITO/Al/ITO), APC alloy, a stacked structure of APC alloy, and ITO (ITO/APC/ITO) to increase reflectivity. The APC alloy is an alloy of silver (Ag), palladium (Pd), and copper (Cu).

The bank 190 serves to define the emission areas EA of the pixels. To this end, the bank 190 may be formed to expose a partial area of the pixel electrode 171 on the second organic layer 180. The bank 190 may cover the edge of the pixel electrode 171. The bank 190 may be located in the third contact hole CT3. That is, the third contact hole CT3 may be at least partially filled by the bank 190. The bank 190 may be formed of an organic layer, such as an acrylic resin, an epoxy resin, a phenolic resin, a polyamide resin, or a polyimide resin.

A spacer 191 may be located on the bank 190. The spacer 191 may serve to support a mask during the process of manufacturing a light-emitting layer 172. The spacer 191 may be formed of an organic layer, such as an acrylic resin, an epoxy resin, a phenolic resin, a polyamide resin, or a polyimide resin.

The light-emitting layer 172 is formed on the pixel electrode 171. The light-emitting layer 172 may include an organic material to emit a color (e.g., predetermined color). For example, the light-emitting layer 172 may include a hole-transporting layer, an organic material layer, and an electron-transporting layer. The organic material layer may include a host and a dopant. The organic material layer may include a material for emitting light (e.g., predetermined light) and may be formed using a phosphorescent material or a fluorescent material.

The common electrode 173 is formed on the light-emitting layer 172. The common electrode 173 may be formed to cover the light-emitting layer 172. The common electrode 173 may be a common layer commonly formed in the emission areas EA1, EA2, EA3, and EA4. A capping layer may be formed on the common electrode 173.

In the upper light-emitting structure, the common electrode 173 may be formed of a transparent conductive material (TCO), such as ITO or IZO that may transmit light, or a semi-transmissive conductive material, such as magnesium (Mg), silver (Ag), or an alloy of magnesium (Mg) and silver (Ag). When the common electrode 173 is formed of a transflective metal material, light output efficiency may be increased by a microcavity.

The encapsulating layer ENC may be formed on the light-emitting element layer EML. The encapsulating layer ENC may include at least one inorganic layer TFE1 and TFE2 to reduce or prevent penetration of oxygen or moisture into the light-emitting element layer EML. Also, the encapsulating layer ENC may include at least one organic layer to protect the light-emitting element layer EML from foreign substances, such as dust. For example, the encapsulating layer ENC may include a first encapsulating inorganic layer TFE1, an encapsulating organic layer TFE2, and a second encapsulating inorganic layer TFE3.

The first encapsulating inorganic layer TFE1 may be located on the common electrode 173, the encapsulating organic layer TFE2 may be located on the first encapsulating inorganic layer TFE1, and the second encapsulating inorganic layer TFE3 may be located on the encapsulation organic layer TFE2. The first encapsulating inorganic layer TFE1 and the second encapsulating inorganic layer TFE3 may be formed as a multilayer in which one or more inorganic layers of a silicon nitride layer, a silicon oxynitride layer, a silicon oxide layer, a titanium oxide layer, and an aluminum oxide layer are alternately stacked. The encapsulating organic layer TFE2 may be an organic film, such as an acrylic resin, an epoxy resin, a phenolic resin, a polyamide resin, or a polyimide resin.

The sensor electrode layer SENL is located on the encapsulating layer ENC. The sensor electrode layer SENL may include sensor electrodes TE and RE.

A second buffer layer BF2 may be located on the encapsulating layer ENC. The second buffer layer BF2 may include at least one inorganic layer. For example, the second buffer layer BF2 may be formed as a multilayer in which one or more inorganic layers of a silicon nitride layer, a silicon oxynitride layer, a silicon oxide layer, a titanium oxide layer, and an aluminum oxide layer are alternately stacked. The second buffer layer BF2 may be omitted.

A first connection parts BE1 may be located on the second buffer layer BF2. The first connection parts BE1 may be formed of a single layer of molybdenum (Mo), titanium (Ti), copper (Cu), or aluminum (Al) or a stacked structure of aluminum and titanium (Ti/Al/Ti), a stacked structure of aluminum and ITO (ITO/Al/ITO), APC alloy, a stacked structure of APC alloy, and/or ITO (ITO/APC/ITO).

A first sensor insulating layer TINS1 may be located on the first connection parts BE1. The first sensor insulating layer TINS1 may be formed of an inorganic layer, for example, a silicon nitride layer, a silicon oxynitride layer, a silicon oxide layer, a titanium oxide layer, or an aluminum oxide layer.

The sensor electrodes, that is, a driving electrodes TE and sensing electrodes RE, may be located on the first sensor insulating layer TINS1. In addition, dummy patterns may be located on the first sensor insulating layer TINS1. The driving electrodes TE, the sensing electrodes RE, and the dummy patterns do not overlap the emission areas EA. The driving electrodes TE, the sensing electrodes RE, and the dummy patterns may be formed of a single layer of molybdenum (Mo), titanium (Ti), copper (Cu), or aluminum (Al) or a stacked structure of aluminum and titanium (Ti/Al/Ti), a stacked structure of aluminum and ITO (ITO/Al/ITO), APC alloy, a stacked structure of APC alloy, and/or ITO (ITO/APC/ITO).

A second sensor insulating layer TINS2 may be located on the driving electrodes TE, the sensing electrodes RE, and the dummy patterns. The second sensor insulating layer TINS2 may include at least one of an inorganic layer and an organic layer. The inorganic layer may be a silicon nitride layer, a silicon oxynitride layer, a silicon oxide layer, a titanium oxide layer, or an aluminum oxide layer. The organic layer may be an acrylic resin, an epoxy resin, a phenolic resin, a polyamide resin, or a polyimide resin.

Figure 6:
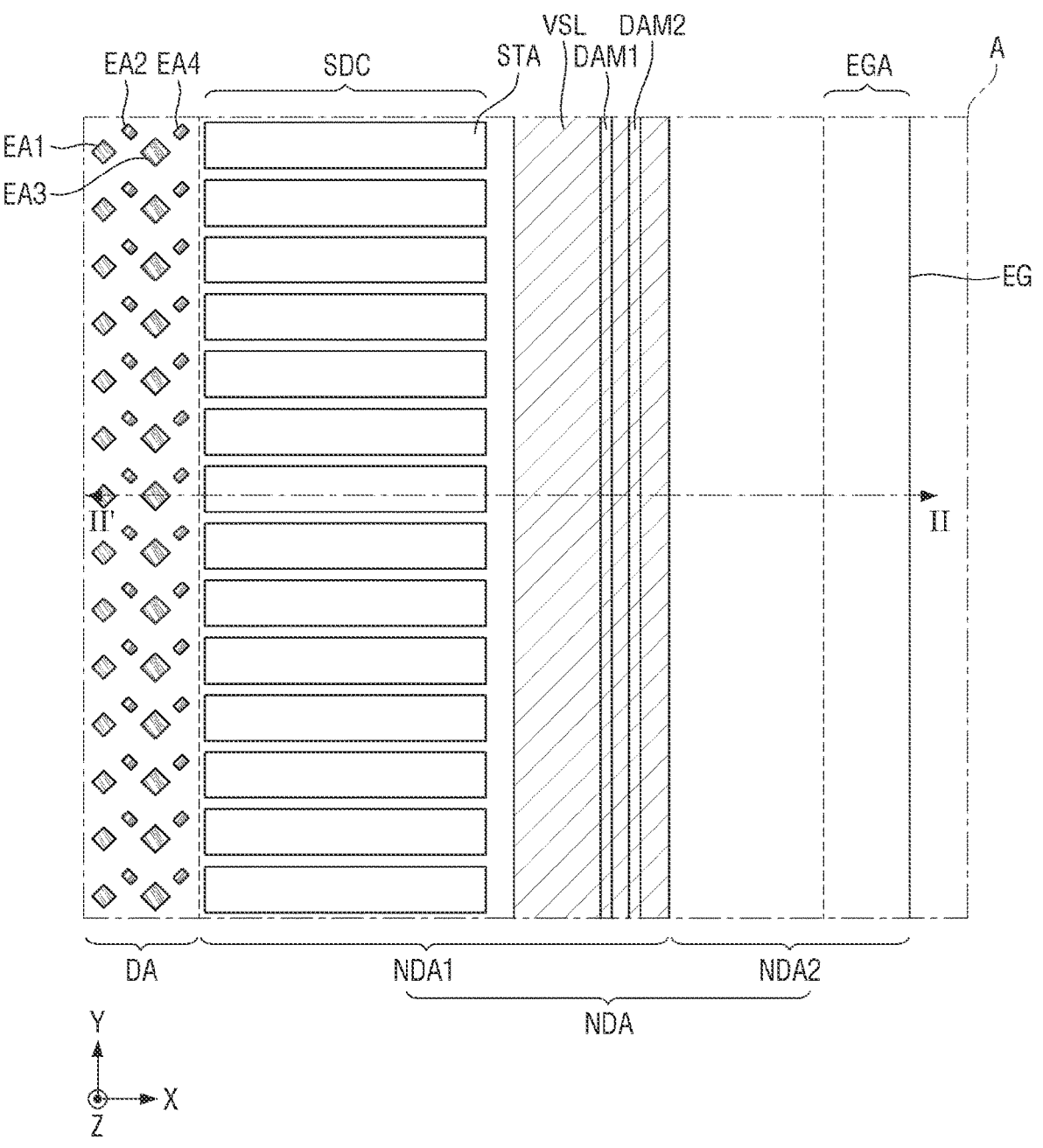
FIG. 6 is a layout diagram illustrating an area A of FIG. 2 in detail, according to one or more embodiments.

FIG. 6 is a layout diagram illustrating an area A of FIG. 2 in detail, according to one or more embodiments. FIG. 6 is a layout diagram illustrating a display area DA and a non-display area NDA located on the right side of the display panel 100 according to one or more embodiments.

Referring to FIG. 6, the display area DA may include a plurality of light-emitting areas EA1, EA2, EA3, and EA4. The plurality of light-emitting areas EA1, EA2, EA3, and EA4 include a first light-emitting area EA1 for emitting light of a first color, a second light-emitting area EA2 and a fourth light-emitting area EA4 for emitting light of a second color, and a third light-emitting area EA3 for emitting light of a third color. For example, the light of the first color is light in a red wavelength band of about 600 nm to about 750 nm, the light of the second color is light in a green wavelength band of about 480 nm to about 560 nm, and the light of the light of third color is light in a blue wavelength band of about 370 nm to about 460 nm but are not limited thereto.

FIG. 6 illustrates that the second light-emitting area EA2 and the fourth light-emitting area EA4 emit light of the same color, that is, light of the second color but is not limited thereto. The second light-emitting area EA2 and the fourth light-emitting area EA4 may emit light of different respective colors. For example, the second light-emitting area EA2 may emit light of a second color, and the fourth light-emitting area EA4 may emit light of a fourth color FIG. 6 illustrated that each of the first light-emitting areas EA1, the second light-emitting areas EA2, the third light-emitting areas EA3, and the fourth light-emitting areas EA4 has a rectangular planar shape, but they are not limited thereto. Each of the first light-emitting areas EA1, the second light-emitting areas EA2, the third light-emitting areas EA3, and the fourth light-emitting areas EA4 may have a polygonal, circular, or elliptical planar shape other than a quadrangle.

Of the first light-emitting area EA1, the second light-emitting area EA2, the third light-emitting area EA3, and the fourth light-emitting area EA4, the area of the third light-emitting area EA3 may be the largest, and the area of the second light-emitting area EA2, and the area of the fourth light-emitting area EA4 may be the smallest. The area of the second light-emitting area EA2 and the area of the fourth light-emitting area EA4 may be the same.

The second light-emitting areas EA2 and the fourth light-emitting areas EA4 may be alternately located in the first direction (X-axis direction). The second light-emitting areas EA2 may be located in columns in the second direction (Y-axis direction). The fourth light-emitting areas EA4 may be located in columns in the second direction (Y-axis direction). Each of the fourth light-emitting areas EA4 has a long side in a first diagonal direction and a short side in a second diagonal direction, while each of the second light-emitting areas EA2 may have a long side in the second diagonal direction DD2 and a short side in the first diagonal direction. The first diagonal direction indicates a diagonal direction between the first direction (X-axis direction) and the second direction (Y-axis direction), and the second diagonal direction may be orthogonal to the first diagonal direction.

The first light-emitting areas EA1 and the third light-emitting areas EA3 may be alternately located in the first direction (X-axis direction). The first light-emitting areas EA1 may be located in the second direction (Y-axis direction). The third light-emitting areas EA3 may be located in the second direction (Y-axis direction). Each of the first light-emitting areas EA1 and the third light-emitting areas EA3 may have a square planar shape, but are not limited thereto. In this case, each of the first light-emitting areas EA1 and the third light-emitting areas EA3 may include two sides parallel to each other in the first diagonal direction, and two sides parallel to each other in the second diagonal direction.

The non-display area NDA includes a first non-display area NDA1 and a second non-display area NDA2. The first non-display area NDA1 may be an area in which structures for driving pixels of the display area DA are located. The second non-display area NDA2 may be located outside the first non-display area NDA1. The second non-display area NDA2 may be an edge area of the non-display area NDA. Also, the second non-display area NDA2 may be an edge area of the display panel 100.

A scan driving circuit unit SDC, a first power supply line VSL, a first dam DAM1 and a second dam DAM2 may be located in the first non-display area NDA1.

The scan driving circuit unit SDC may include a plurality of stages STA. The plurality of stages STA may be respectively connected to the scan lines SL of the display area DA extending in the first direction (X-axis direction). That is, the plurality of stages STA may be one-to-one connected to the scan lines of the display area DA extending in the first direction (X-axis direction). The plurality of stages STA may sequentially apply scan signals to the plurality of scan lines.

The first power supply line VSL may be located outside the scan driving circuit unit SDC. That is, the first power supply line VSL may be located closer to an edge EG of the display panel 100 than the scan driving circuit unit SDC. The first power supply line VSL may extend in the second direction (Y-axis direction) in the non-display area NDA on the side of the display panel 100.

The first power supply line VSL may be electrically connected to the common electrode 173, so that the common electrode 173 may receive the first power supply voltage from the first power supply line VSL.

The first dam DAM1 and the second dam DAM2 are structures for reducing or preventing overflow of the encapsulating organic layer TFE2 of the encapsulating layer ENC to the edge EG of the display panel 100. The first dam DAM1 and the second dam DAM2 may extend in the second direction (Y-axis direction) in the non-display area NDA on the side of the display panel 100. The second dam DAM2 may be located outside the first dam DAM1. The first dam DAM1 may be located closer to the scan driving circuit unit SDC than the second dam DAM2, and the second dam DAM2 may be located closer to the edge EG of the display panel 100 than the first dam DAM1.

FIG. 6 illustrates that the first dam DAM1 and the second dam DAM2 are located on the first power supply line VSL, but is not limited thereto. For example, any one of the first dam DAM1 and/or the second dam DAM2 may not be located on the first power supply line VSL. Alternatively, neither the first dam DAM1 nor the second dam DAM2 may be located on the first power supply line VSL. In this case, the first dam DAM1 and the second dam DAM2 may be located outside the first power supply line VSL.

FIG. 6 illustrates that the display panel 100 includes two dams DAM1 and DAM2 but is not limited thereto. In some embodiments, the display panel 100 may include three or more dams.

The first power supply line VSL may be a first outer structure located in the first non-display area NDA1. The first outer structure may be located farther away from the edge EG of the display panel 100 than the outermost structure. That is, the distance from the first power supply line VSL, which is the first outer structure, to the edge EG of the display panel 100 may be greater than the distance from the outermost structure to the edge EG of the display panel 100.

The distance from the first supply power supply line VSL to the edge EG of the display panel 100 on the left or right side of the display panel 100 may be less than the distance from the first power supply line VSL to the edge EG of the display panel 100 from the upper side of the display panel 100. For example, the distance from the first power supply line VSL to the edge EG of the display panel 100 on the left or right side of the display panel 100 may be about 160 μm or less. Also, the distance from the first power supply line VSL to the edge EG of the display panel 100 on the upper side of the display panel 100 may be about 445 μm or less.

The second dam DAM2 may be a second outer structure located in the first non-display area NDA1. The second outer structure may be located closer the edge EG of the display panel 100 than the first outer structure. The distance from the second dam DAM2, which is the second outer structure, to the edge EG of the display panel 100 may be less than the distance from the first power supply line VSL, which is the first outer structure, to the edge EG of the display panel 100.

The distance from the second dam DAM2 to the edge EG of the display panel 100 on the left or right side of the display panel 100 may be less than the distance from the second dam DAM2 to the edge EG of the display panel 100 on the upper side of the display panel 100. For example, the distance from the second dam DAM2 to the edge EG of the display panel 100 on the side of the display panel 100 may be about 220 μm or less. Also, the distance from the second dam DAM2 to the edge EG of the display panel 100 on the upper side of the display panel 100 may be about 445 μm or less.

The second non-display area NDA2 may include an edge area EGA. The edge area EGA may be located along the edge EG of the display panel 100. The edge area EGA may be an area in which machining marks generated in a process of cutting the substrate SUB remain.

Figure 7:
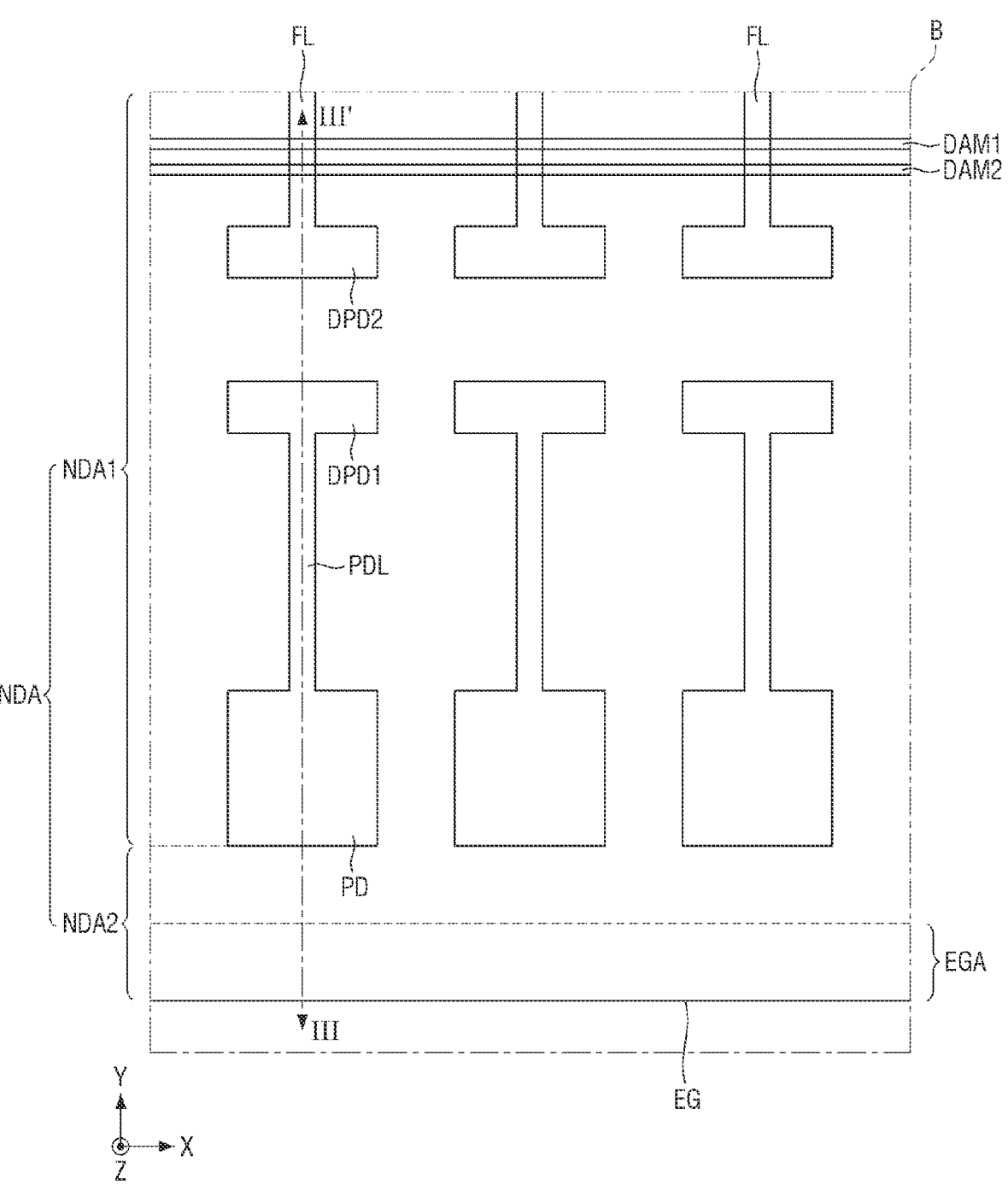
FIG. 7 is a layout diagram illustrating a region B of FIG. 2 in detail, according to one or more embodiments.

FIG. 7 is a layout diagram illustrating an area B of FIG. 2 in detail, according to one or more embodiments. FIG. 7 is a layout diagram illustrating a non-display area NDA located below the display panel 100 according to one or more embodiments.

Referring to FIG. 7, the first non-display area NDA1 may be located a plurality of display pads PD, a plurality of first driving pads DPD1, a plurality of second driving pads DPD2, and a plurality of pad lines, a plurality of fan-out lines, the first dam DAM1, and the second dam DAM2.

The plurality of display pads PD may be electrically connected to the circuit board 300 through the conductive adhesive member, such as the anisotropic conductive film and the anisotropic conductive adhesive. Each of the plurality of display pads PD may be connected to the pad line PDL. The pad line PDL may connect the display pad PD and a first driving pad DPD1.

The plurality of first driving pads DPD1 and the plurality of second driving pads DPD2 may be electrically connected to the driving IC 200 through the conductive adhesive member, such as the anisotropic conductive film and the anisotropic conductive adhesive. The plurality of first driving pads DPD1 may be input pads for the driving IC 200 to receive signals (e.g., digital video data, data timing control signal, etc.) of the circuit board 300. The plurality of second driving pads DPD2 may be output pads for outputting signals (e.g., data voltages) of the driving IC 200. Each of the plurality of second driving pads DPD2 may be connected to the fan-out line FL. The fan-out line FL may connect the second driving pad DPD2 and the data line of the display area DA.

Each of the plurality of first driving pads DPD1 may be located closer to the display area DA in the second direction (Y-axis direction) than the display pad PD connected thereto. That is, among the display pad PD and the first driving pad DPD1 that are connected to each other, the display pad PD may be located closer to the edge EG of the display panel 100 in the second direction (Y-axis direction) than the first driving pad DPD1).

Each of the plurality of second driving pads DPD2 may be located closer to the display area DA in the second direction (Y-axis direction) than any one of the plurality of first driving pads DPD1. That is, the first driving pad DPD1 may be located closer to the edge EG of the display panel 100 in the second direction (Y-axis direction) than any one of the second driving pads DPD2 among the plurality of second driving pads DPD.

The first dam DAM1 and the second dam DAM2 may cross the fan-out line FL. The first dam DAM1 and the second dam DAM2 may extend in the first direction (X-axis direction) in the non-display area NDA under the display panel 100. The second dam DAM2 may be located outside the first dam DAM1. The first dam DAM1 may be located closer to a display area DA than the second dam DAM2, and the second dam DAM2 may be located closer to the edge EG of the display panel 100 than the first dam DAM1.

Figure 8:
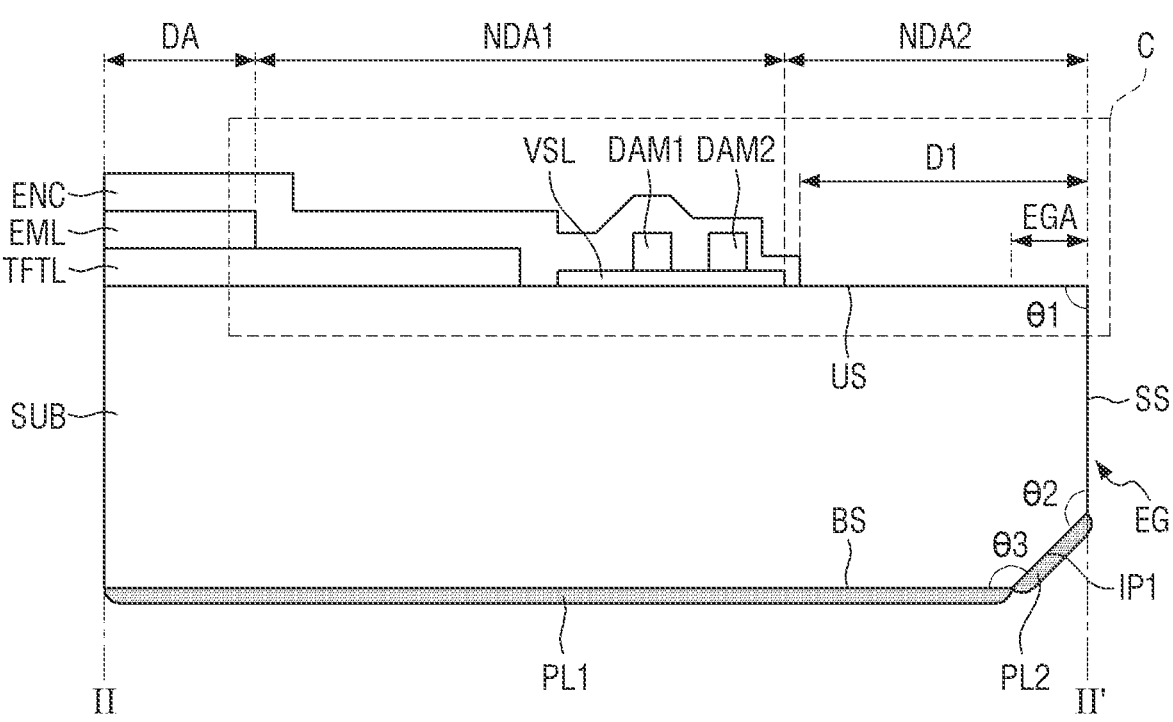
FIG. 8 is a cross-sectional view illustrating a display panel taken along the line II-II' of FIG. 6, according to one or more embodiments.
Figure 9:
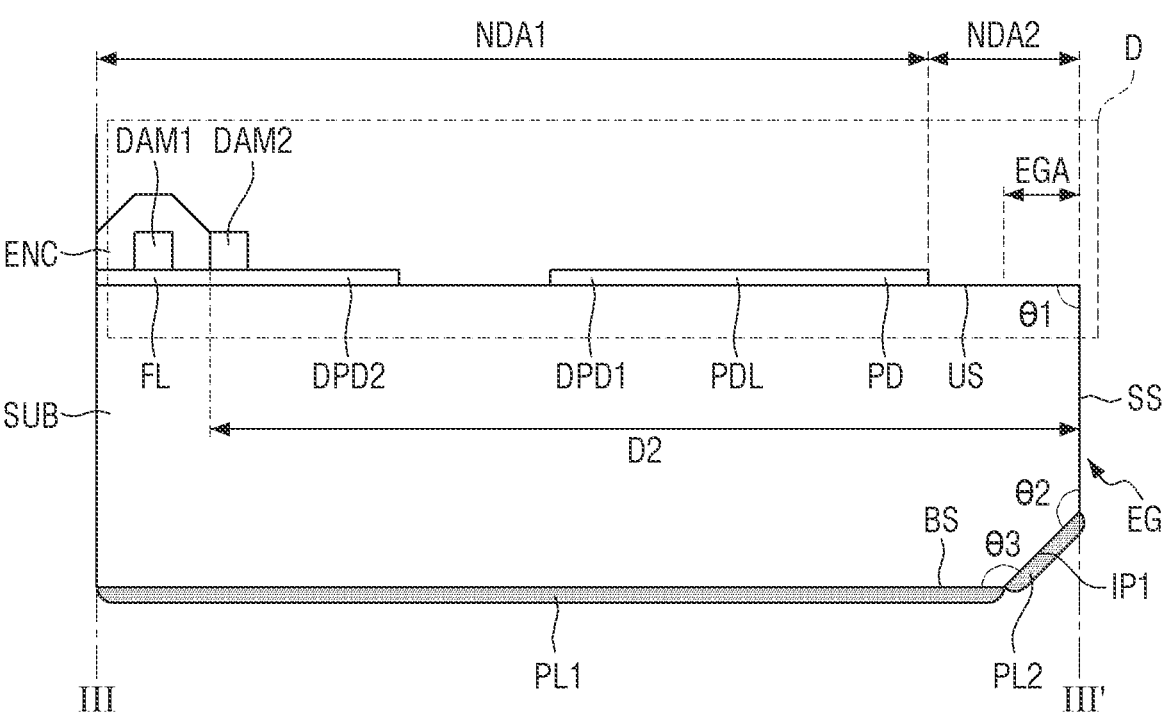
FIG. 9 is a cross-sectional view illustrating a display panel taken along the line III-III' of FIG. 7, according to one or more embodiments.

FIG. 8 is a cross-sectional view illustrating a display panel taken along the line II-II' of FIG. 6, according to one or more embodiments. FIG. 9 is a cross-sectional view illustrating a display panel taken along the line III-III' of FIG. 7, according to one or more embodiments.

FIGS. 8 and 9 schematically show a cross-section of the display panel 100 when the substrate SUB of the display panel 100 is cut by irradiating a laser during the manufacturing process of the display panel 100, and by then spraying an etchant.

Referring to FIGS. 8 and 9, the edge area EGA may be an area in which a processing mark is formed on the upper surface UP of the substrate SUB by an irradiated laser when the edge area EGA is irradiated with a laser, and then an etchant is sprayed to cut the substrate SUB by the irradiated laser. In one or more embodiments, the edge area EGA may be within about 50 μm. The edge area EGA left by laser processing by a width of about 50 μm or less along the edge EG may be formed in the display panel 100.

The substrate SUB of the display panel 100 may include a first inclined surface IP1 formed to be inclined to, rather than perpendicular to, the third direction (Z-axis direction). The first inclined surface IP1 may be formed by irradiating a laser and then spraying an etchant. The first inclined surface IP1 overlaps the edge area EGA, and the processing mark formed on the upper surface UP of the substrate SUB may overlap the first inclined surface IP1 in the third direction (Z-axis direction).

An angle θ1 between the side surface SS and the upper surface UP of the substrate SUB of the display panel 100 may be about 90°. That is, the angle between the side surface SS and the upper surface UP of the substrate SUB may be substantially close to a vertical angle. The side surface SS and the upper surface UP are not parallel to each other in one or more embodiments. An angle θ2 formed between the side surface SS of the substrate SUB and the first inclined surface IP1, and an angle θ3 formed between the first inclined surface IP1 and the bottom surface BS, may be obtuse angles. The first inclined surface IP1 is not parallel to either the bottom surface BS or the side surface SS in one or more embodiments.

The first inclined surface IP1 is an inclined surface formed directly by the etchant, whereas the processing mark is a trace formed by the penetration of the etchant penetrating between an acid-resistant film and the upper surface of the substrate SUB in the manufacturing process. Therefore, the width of the edge area EGA in which the processing marks are formed may be less than the width of the first inclined surface IP1. The width of the edge area EGA may indicate a length of the edge area EGA in the first direction (X-axis direction) or in the second direction (Y-axis direction). The width of the first inclined surface IP1 may indicate a length of the first inclined surface IP1 in the first direction (X-axis direction) or in the second direction (Y-axis direction).

According to one or more embodiments, a distance D1 from the edge EG of the display panel 100 to the encapsulating layer ENC may be at most about 300 μm or less. When the substrate SUB is cut by spraying the etchant after laser irradiation, the distance D1 from the edge EG of the display panel 100 to the encapsulating layer ENC may vary depending on the tolerance of one side of the laser. For example, when the laser unilateral tolerance is about 50 μm, the distance D1 from the edge EG of the display panel 100 to the encapsulating layer ENC may be about 200 μm or less. However, the present disclosure is not limited thereto. The distance D1 from the edge EG of the display panel 100 to the encapsulating layer ENC may be about 0 μm. A description of the distance D1 from the edge EG of the display panel 100 to the encapsulating layer ENC due to the laser unilateral tolerance will be described later in conjunction with the manufacturing process of the display device 10.

The display pad PD may be the outermost structure located on the outermost side under the display panel 100. Even under the display panel 100, a distance D2 between the edge EG of the display panel 100 and the encapsulating layer ENC may be about 300 μm or less. However, because the display pads PD are located below the display panel 100, the distance D1 between the edge EG and the encapsulating layer ENC on the left and right sides and the upper side of the display panel 100 may be less than the distance D2 between the edge EG and the encapsulating layer ENC on the bottom side of the display panel 100. Also, in one or more embodiments, the minimum distance between the display pad PD and the edge EG may be about 80 μm or less.

The minimum distance from the display pad PD to the edge EG of the substrate SUB may be the sum of the width of the edge area EGA and the minimum distance from the display pad PD to the edge area EGA. When the substrate SUB is cut by spraying the etchant after laser irradiation, the minimum distance from the display pad PD to the edge EG of the substrate SUB may vary depending on the tolerance of one side of the laser. For example, when the minimum distance between the display pad PD and the edge EG is designed to be about 80 μm, the minimum distance between the display pad PD and the edge EG may be about 130 μm or less due to the unilateral tolerance of about 50 μm of the laser.

The substrate SUB of the display panel 100 may be cut by irradiating the laser during the manufacturing process, and then by spraying the etchant, and the side surface SS and the first inclined surface IP1 of the display panel 100 may be etched by the etchant. The roughness of the side surface SS and the first inclined surface IP1 of the display panel 100 may be about 0.5 μm or less. When the substrate SUB of the display panel 100 is cut by spraying the etching solution after irradiating the laser, the roughness of the side surface SS and the first inclined surface IP1 of the display panel 100 may be relatively less than when the substrate SUB is cut with a cutting member, and then a polishing process may be performed.

In addition, because the side surface SS of the display panel 100 is formed by the laser and the etchant, while the first inclined surface IP1 is formed by the etchant, the roughness of the side surface SS of the display panel 100 may be different from the roughness of the first inclined surface IP1. For example, a difference between the roughness of the side surface SS of the display panel 100 and the roughness of the first inclined surface IP1 may be about 1% to about 20%.

Meanwhile, as will be described later, in the display device 10, a process of separating the substrate SUB from the mother substrate (MSUB in FIG. 14) may be performed. Accordingly, the edge area EGA, in which the processing mark is left, may be formed on the substrate SUB of the display panel 100, and a first inclined surface IP1, on which a bottom surface or a part of the side surface is inclined, may be formed. This structural shape of the display panel 100 may be relatively vulnerable to external impact. To protect this, the display device 10 may further include protective layers PL1 and PL2 located on at least a part of the end surface of the substrate SUB of the display panel 100.

According to one or more embodiments, the display device 10 may include protective layers PL1 and PL2 located on a part of the substrate SUB of the display panel 100 on which the display layer DISL is not located. The display layer DISL may be located on the upper surface US of the substrate SUB, and the protective layers PL1 and PL2 may be located on at least a part of the bottom surface BS, the side surface SS, and the first inclined surface IP1 of the substrate SUB. FIGS. 8 and 9 illustrate that the protective layers PL1 and PL2 are located on the bottom surface BS and the first inclined surface IP1 of the substrate SUB. However, the present disclosure is not limited thereto, the protective layers PL1 and PL2 may also be located on the side surface SS of the substrate SUB, or may also be located on an area adjacent to the edge EG among areas on the upper surface US where the display layer DISL is not located.

The protective layers PL1 and PL2 may include a first protective layer PL1 located on the bottom surface BS of the substrate SUB, and a second protective layer PL2 located on the first inclined surface IP1 of the substrate SUB. The first protective layer PL1 and the second protective layer PL2 may include the same material, but may be formed in separate processes, and might not be integrated with each other. However, the present disclosure is not limited thereto, and the first protective layer PL1 and the second protective layer PL2 may be concurrently or substantially simultaneously formed and integrated. The first protective layer PL1 may protect the display panel 100 from an impact applied to the bottom surface of the substrate SUB, and the second protective layer PL2 may protect the display panel 100 from the impact applied to the first inclined surface IP1 of the substrate SUB.

Because the display layer DISL is located on the upper surface US of the substrate SUB, it may be suitable to protect the display layer DISL by another member, for example, the encapsulating layer ENC. On the other hand, if the side surface SS, the first inclined surface IP1, and the bottom surface BS of the substrate SUB are exposed as they are, they may be very vulnerable to external impact. For example, the substrate SUB may be cut and separated from the mother substrate (MSUB in FIG. 14), and the bottom surface BS and the first inclined surface IP1 of the substrate SUB may be the surface etched by the etchant in the manufacturing process of the display device 10. The bottom surface BS and the first inclined surface IP1 of the substrate SUB are surfaces on which chemical processing is performed, and may be surfaces having weaker mechanical strength due to chemical deformation compared to other parts. In addition, because the first inclined surface IP1 is the inclined surface extending in the diagonal direction, as compared to the bottom surface BS, mechanical strength may be decreased according to the shape thereof. The display device 10 according to one or more embodiments may include the first protective layer PL1 located on the bottom surface BS of the substrate SUB of the display panel 100, and the second protective layer PL2 located on the first inclined surface IP1. Also, the display device 10 according to one or more embodiments may protect a surface that is vulnerable to external impact of the substrate SUB.

The protective layers PL1 and PL2 may have the mechanical strength sufficient to protect the substrate SUB from external impact, and may include a material having a relatively thin thickness to reduce or minimize an area of an unnecessary area of the display panel 100. In one or more embodiments, the protective layers PL1 and PL2 may include a siloxane-based polymer resin. For example, the protective layers PL1 and PL2 may include perhydropolysilazane (PHPS) or organic polysilazane. Polysilazane may be a material that is similar to that of the substrate SUB, and may have physical properties that are cured upon UV irradiation. In addition, when the polysilazane is formed on the substrate SUB, it may be possible to form a thin film to have a relatively thin thickness. In the display device 10, the protective layers PL1 and PL2 of the display panel 100 may include the polysilazane to easily control the shape of the edge EG of the display panel 100. The protective layers PL1 and PL2 may have a thickness of about 100 μm or less in accordance with the purpose of reducing or minimizing an unnecessary outer area of the display panel 100.

Figure 10:
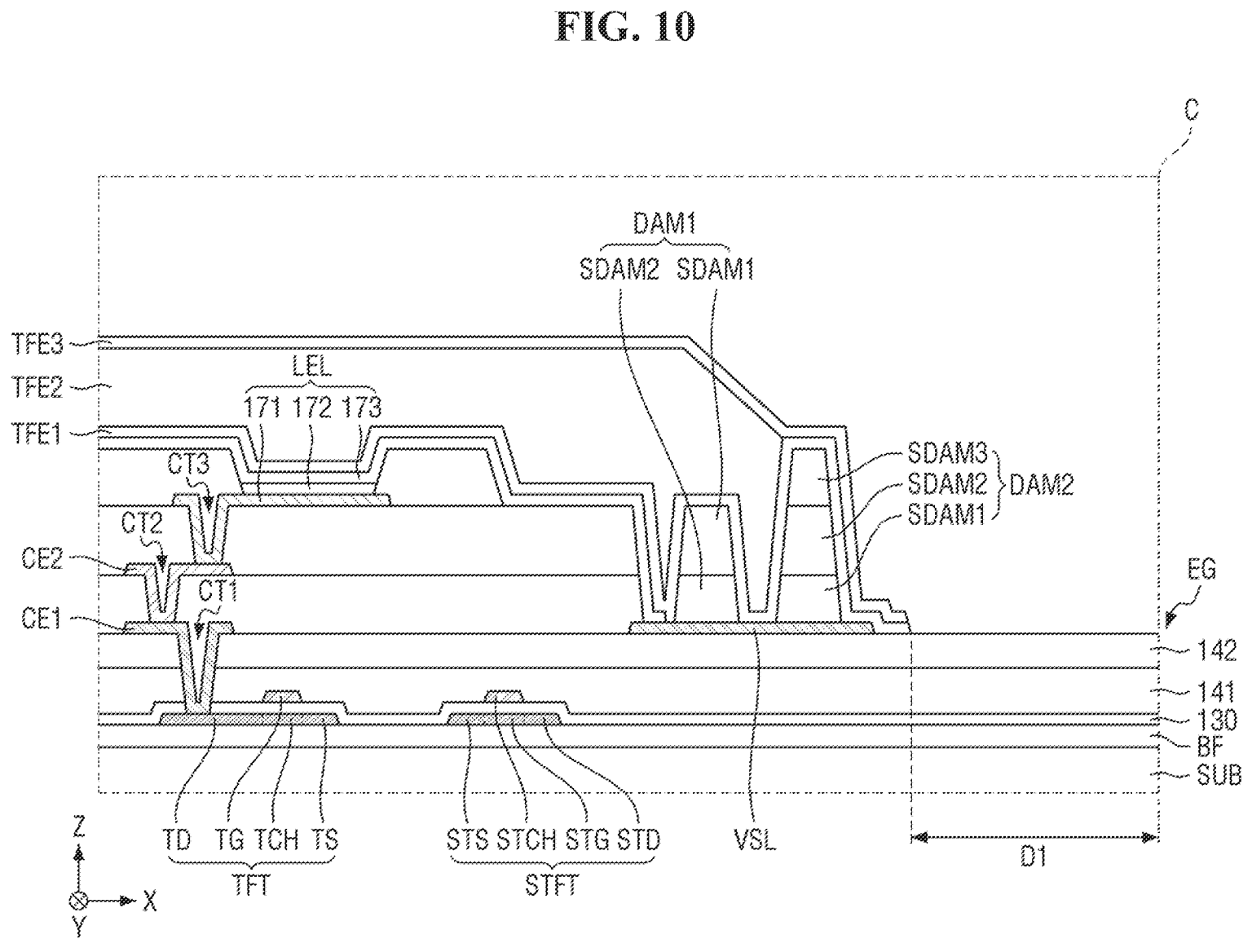

FIG. 10 is a cross-sectional view illustrating area C of FIG. 8 in more detail. In FIG. 10, the stacked structure on the right side of the display panel 100 is illustrated in more detail.

Referring to FIG. 10, the first power supply line VSL may include the same material as the first data metal layer that includes the first connection electrode CE1 and the data lines, and may be located on/at the same layer. The first power supply line VSL may be located on the second interlayer insulating layer 142. The first power supply line VSL may be formed of a single layer or of multiple layers made of any one of molybdenum (Mo), aluminum (Al), chromium (Cr), gold (Au), titanium (Ti), nickel (Ni), neodymium (Nd), and/or copper (Cu), or an alloy thereof.

The first dam DAM and the second dam DAM2 may be located on the first power supply line VSL. The first dam DAM1 may include a first sub-dam SDAM1 and a second sub-dam SDAM2, and the second dam DAM2 may include the first sub-dam SDAM1, the second sub-dam SDAM2, and a third sub-dam SDAM3. The first sub-dam SDAM1 may include the same material as the first organic layer 160, and may be located on/at the same layer. The second sub-dam SDAM2 may include the same material as the second organic layer 180, and may be located on/at the same layer. The third sub-dam SDAM3 may include the same material as the bank 190, and may be located on/at the same layer.

The height of the first dam DAM1 may be lower than the height of the second dam DAM2, but the present disclosure is not limited thereto. The height of the first dam DAM1 may be substantially the same as the height of the second dam DAM2, or may be higher than the height of the second dam DAM2.

The common electrode 173 may be connected to the first organic layer 160, the second organic layer 180, and the first power supply line VSL that is not covered by the first dam DAM1 and is exposed. Accordingly, the common electrode 173 may receive the first power supply voltage of the first power supply line VSL.

The first encapsulating inorganic layer TFE1 may cover the first dam DAM1 and the second dam DAM2 in the non-display area NDA on the side of the display panel 100. The first encapsulating inorganic layer TFE1 may extend from the non-display area NDA on the side of the display panel 100 to cover the first power supply line VSL.

The encapsulating organic layer TFE2 may cover the upper surface of the first dam DAM1 while not covering the upper surface of the second dam DAM2. However, the embodiments of the present specification are not limited thereto. The encapsulating organic layer TFE2 may not cover both the upper surface of the first dam DAM1 and the upper surface of the second dam DAM2. The encapsulating organic layer TFE2 may not overflow to the edge EG of the display panel 100 due to the first dam DAM1 and the second dam DAM2.

The second encapsulating inorganic layer TFE3 may cover the first dam DAM1, the second dam DAM2, and a crack dam CRD (e.g., see FIGS. 32 to 34) in the non-display area NDA on the side of the display panel 100. The second encapsulating inorganic layer TFE3 may extend from the non-display area NDA on the side of the display panel 100 to the edge EG of the display panel 100.

An inorganic encapsulating area in which the first encapsulating inorganic layer TFE1 and the second encapsulating inorganic layer TFE3 contact each other may be formed from the second dam DAM2 to the edge EG of the display panel 100. The inorganic encapsulating area may surround the second dam DAM2.

In addition, a scan thin film transistor STFT of the scan driving circuit unit SDC is illustrated in FIG. 10. Because the scan thin film transistor STFT is substantially the same as the thin film transistor TFT described with reference to FIG. 6, a description of the scan thin film transistor STFT will be omitted.

In the one or more embodiments corresponding to FIG. 10, respective edges the first encapsulating inorganic layer TFE1 and the second encapsulating inorganic layer TFE3 of the encapsulation layer ENC are closer to the second dam DAM2 than to the edge EG of the display panel 100. Accordingly, in one or more embodiments, the edge area EGA where the laser-irradiated trace remains might not overlap the first encapsulating inorganic layer TFE1 and the second encapsulating inorganic layer TFE3 of the encapsulating layer ENC. However, the present disclosure is not limited thereto. In some embodiments, the first encapsulating inorganic layer TFE1 and the second encapsulating inorganic layer TFE3 of the encapsulation layer ENC may extend to the edge EG of the display panel 100 of the display device 10, and the edge area EGA may overlap the encapsulating layer ENC.

Figure 11:
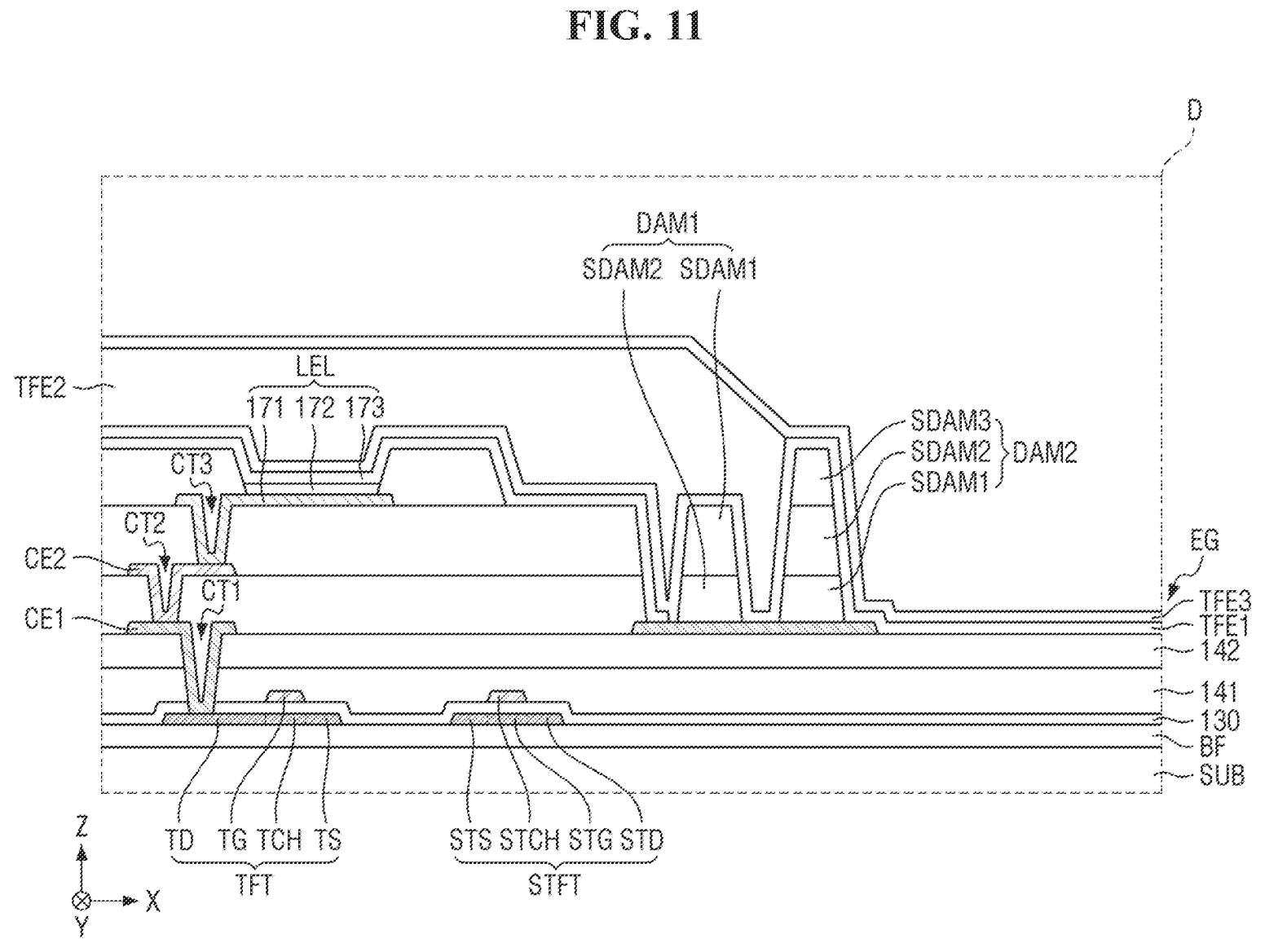

FIG. 11 is a cross-sectional view illustrating another example of area C of FIG. 8 in more detail.

Referring to FIG. 11, the first encapsulating inorganic layer TFE1 and the second encapsulating inorganic layer TFE3 cover the first dam DAM1 and the second dam DAM2 in the non-display area NDA on the side of the display panel 100, and may extend to the edge EG of the display panel 100. An inorganic encapsulating area in which the first encapsulating inorganic layer TFE1 and the second encapsulating inorganic layer TFE3 contact each other may be formed from the second dam DAM2 to the edge EG of the display panel 100. The inorganic encapsulating area may surround the second dam DAM2, and may extend to the edge EG of the display panel 100 to cover the second interlayer insulating layer 142.

Figure 12:
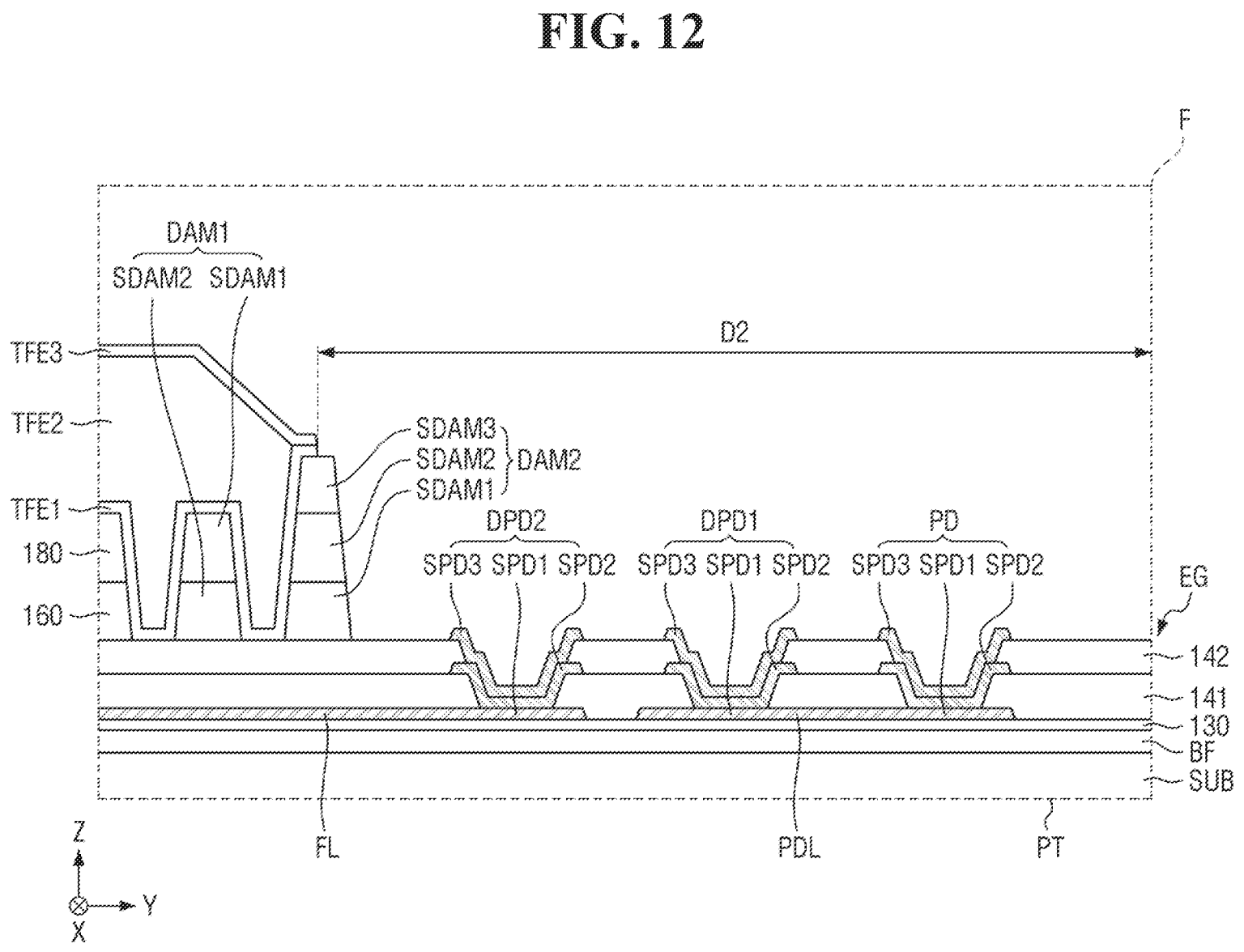

FIG. 12 is a cross-sectional view illustrating an area D of FIG. 9 in more detail. FIG. 12 illustrates in more detail a stacked structure on the bottom side of the display panel 100.

Referring to FIG. 12, each of the display pad PD, the first driving pad DPD1, and the second driving pad DPD2 may include a first sub pad SPD1, a second sub pad SPD2, and a third sub pad SPD3.

The first sub pad SPD1 includes the same material as the first gate metal layer including the gate electrode TG, the first capacitor electrode CAE1 of the capacitor Cst, and the scan lines, and may be located on/at the same layer. The first sub pad SPD1 may be located on the gate insulating layer 130. The first sub pad SPD1 may be formed of a single layer or of a multilayer formed of any one of molybdenum (Mo), aluminum (Al), chromium (Cr), gold (Au), titanium (Ti), nickel (Ni), neodymium (Nd), and/or copper (Cu) or an alloy thereof.

The second sub pad SPD2 may include the same material as the second gate metal layer including the second capacitor electrode CAE2, and may be located on/at the same layer. The second sub pad SPD2 may be located on the first interlayer insulating layer 141. The second sub pad SPD2 may be formed of a single layer or of multiple layers made of any one of molybdenum (Mo), aluminum (Al), chromium (Cr), gold (Au), titanium (Ti), nickel (Ni), neodymium (Nd), and/or copper (Cu), or an alloy thereof.

The third sub pad SPD3 may include the same material as the first data metal layer including the first connection electrode CE1 and the data lines and may be located on/at the same layer. The third sub pad SPD3 may be located on the second interlayer insulating layer 142. The third sub pad SPD3 may be formed of a single layer or of multiple layers made of any one of molybdenum (Mo), aluminum (Al), chromium (Cr), gold (Au), titanium (Ti), nickel (Ni), neodymium (Nd), and/or copper (Cu), or an alloy thereof.

The third sub pad SPD3 of the display pad PD may be electrically connected to the circuit board 300 through the conductive adhesive member, such as the anisotropic conductive film or the anisotropic conductive adhesive. The third sub pad SPD3 of the first driving pad DPD1 may be electrically connected to an input bump of the driving IC 200 through the conductive adhesive member, such as the anisotropic conductive film or the anisotropic conductive adhesive. The third sub pad SPD3 of the second driving pad DPD2 may be electrically connected to an output bump of the driving IC 200 through the conductive adhesive member, such as the anisotropic conductive film or the anisotropic conductive adhesive. For convenience of description, the driving IC 200 and the circuit board 300 are omitted in FIG. 12.

The first encapsulating inorganic layer TFE1 and the second encapsulating inorganic layer TFE3 may cover the first dam DAM1 and a part of the second dam DAM2 under the display panel 100. For example, the first encapsulating inorganic layer TFE1 and the second encapsulating inorganic layer TFE3 may be located not to cover a part of the upper surface of the second dam DAM2. Alternatively, the first encapsulating inorganic layer TFE1 and the second encapsulating inorganic layer TFE3 may be covered, but in this case, the third sub pad SPD3 of the second driving pad DPD2 might not be covered. That is, the first encapsulating inorganic layer TFE1 and the second encapsulating inorganic layer TFE3 might not extend to the display pad PD, the first driving pad DPD1, and the second driving pad DPD2 adjacent the edge EG of the display panel 100 in the bottom side of the display panel 100.

The display device 10 according to one or more embodiments may be formed by the process of cutting the substrate SUB of the display panel 100 through a process of irradiating a laser, and then by spraying the etchant. Because the substrate SUB is cut by a process using a laser, the distances D1 and D2 from the encapsulating layer ENC to the edge EG of the display panel 100 in the display panel 100 may be less than a case in which the polishing process is performed after the substrate SUB is cut using a cutting member. Accordingly, the display device 10 may greatly reduce the width of the non-display area of the display panel 100, for example, the second non-display area NDA2, and may reduce or minimize an area that unnecessarily occupies space in the display panel 100.

In addition, the display device 10 may supplement the mechanical strength of the substrate SUB separated from the mother substrate MSUB through the laser process and the etching process by including the protective layers PL1 and PL2 located on the substrate SUB of the display panel 100. The display device 10 may reduce or minimize the width of the outer area of the display panel 100 and may have resistance to external impact.

Hereinafter, a manufacturing process of the display device 10 according to one or more embodiments will be described with reference to other drawings.

FIG. 13 is a flowchart illustrating a manufacturing process of a display device according to one or more embodiments.

Referring to FIG. 13, the method of manufacturing the display device 10 according to one or more embodiments may include preparing the mother substrate (MSUB in FIG. 14) and forming the plurality of display cells (DPC in FIG. 14) on one surface of the mother substrate (MSUB) (S100), forming a cutting line (LS in FIG. 15) along the periphery of the display cell (DPC) by irradiating the laser from the other surface opposite to the one surface of the mother substrate (MSUB) (S200), separating the substrate SUB on which the display cell DPC is formed by etching the mother substrate MSUB along the other surface and a cutting line LS (S300), and forming protective layers PL1 and PL2 on the outer surfaces of the separated substrate SUB (S400).

The display device 10 may be formed through the process of separating a plurality of substrates SUB on which one display cell DPC is formed from the mother substrate MSUB on which the plurality of display cells DPC are formed. The process of separating the plurality of substrates SUB from the mother substrate MSUB may include the process of irradiating the laser and the process of separating the substrates SUB by etching the mother substrate MSUB. The display device 10 may be manufactured by performing the laser process, and the substrate SUB may reduce or minimize the area of the outer part where the display cells DPC are not located.

In addition, the method of manufacturing the display device 10 may include the process of forming the protective layers PL1 and PL2 on the substrate SUB after the separation process of the substrate SUB. Although the mechanical strength of the substrate SUB may be lowered by the laser process and the etching process in the display device 10, the substrate SUB may have resistance to external impact by including the protective layers PL1 and PL2.

Hereinafter, the manufacturing process of the display device 10 will be described in more detail with reference to other drawings.

FIGS. 14 to 18 are perspective and cross-sectional views sequentially illustrating a part of a manufacturing process of a display device according to one or more embodiments. FIGS. 19 to 22 are cross-sectional views sequentially illustrating a part of a manufacturing process of a display device according to one or more embodiments.

FIGS. 14 to 18 are perspective and cross-sectional views of the mother substrate MSUB and the plurality of display cells DPC located on the mother substrate MSUB. FIGS. 19 to 22 show cross-sections of the mother substrate MSUB and the plurality of display cells DPC cut along the line VIII-VIII' in FIGS. 14 to 18.

Figure 14:
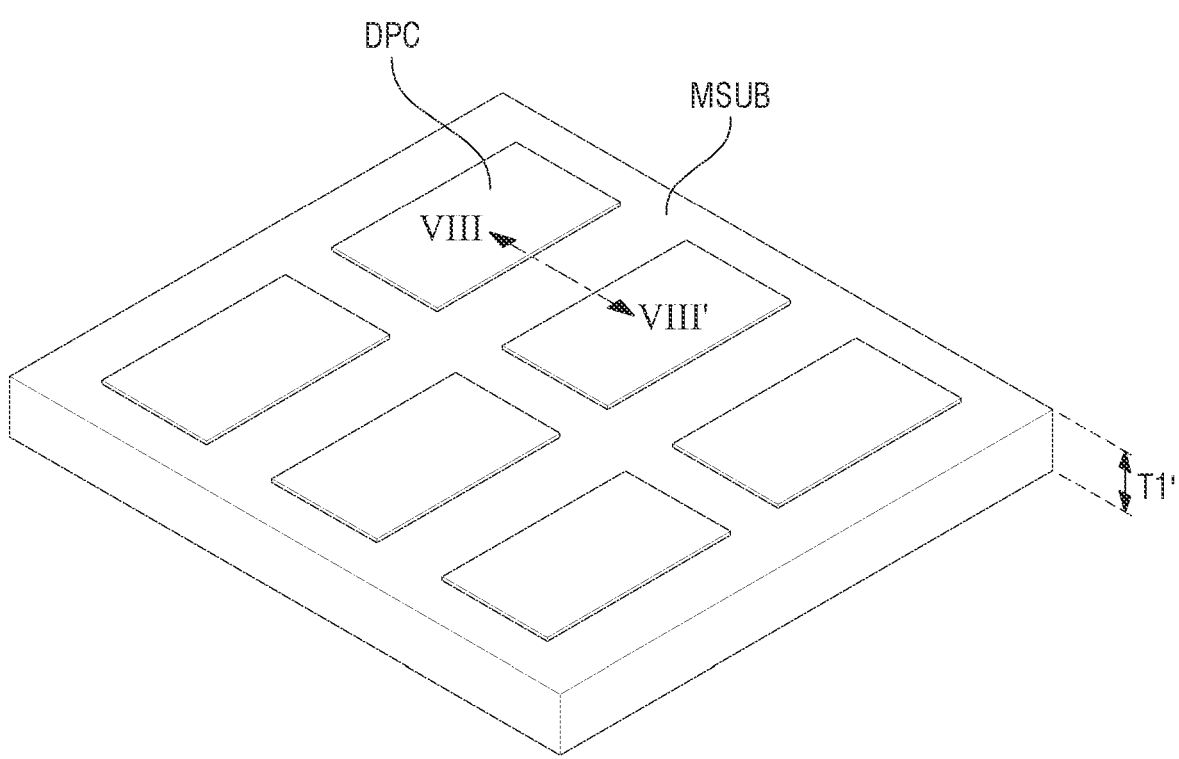
Figure 19:
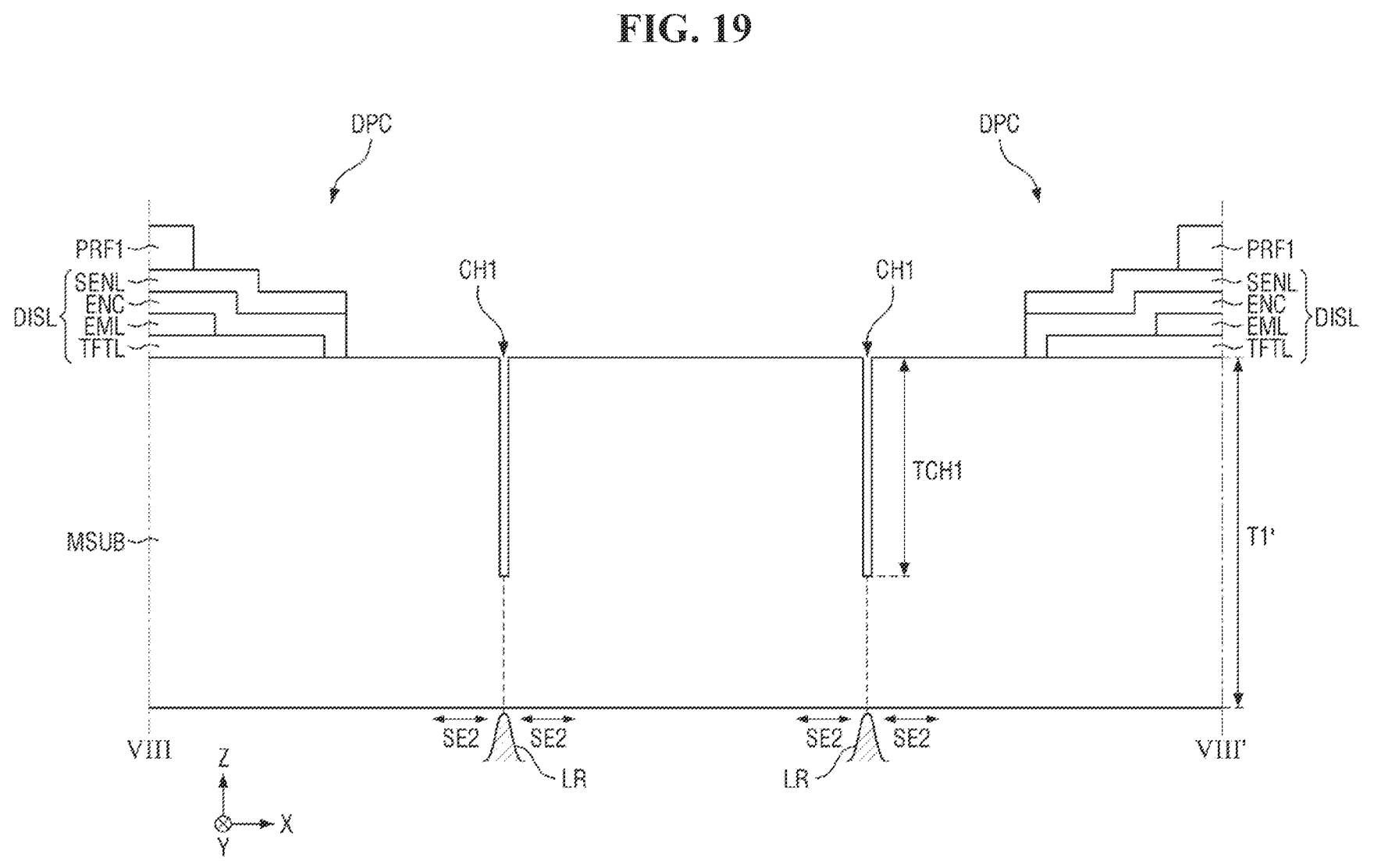

Referring to FIGS. 14 and 19, first, the plurality of display cells DPC are formed on the first surface of the mother substrate MSUB, then, the plurality of first protective films PRF1 are attached on the plurality of display cells DPC, finally, the plurality of display cells DPC are inspected.

The display layer DISL of each of the plurality of display cells DPC is formed on the first surface of the mother substrate MSUB. The display layer DISL includes the thin film transistor layer TFTL, the light-emitting element layer EML, the encapsulating layer ENC, and the sensor electrode layer SENL. The description of the structure of the display layer DISL is the same as described above.

Next, the first protective film layer is attached to cover the plurality of display cells DPC and the mother substrate MSUB located between the plurality of display cells DPC. Then, the plurality of first protective films PRF1 may be respectively located on the plurality of display cells DPC by removing a portion of the first protective film layer located on the mother substrate MSUB. A portion of the first protective film layer may be removed, and the remaining portions may be the plurality of first protective films PRF1. The plurality of first protective films PRF1 may be respectively located on the plurality of display cells DPC. The plurality of first protective films PRF1 may correspond to the plurality of display cells DPC on a one-to-one basis.

Each of the plurality of first protective films PRF1 may be a buffer film for protecting the plurality of display cells DPC from external impact. The plurality of first protective films PRF1 may be made of a transparent material.

Next, the plurality of display cells DPC are inspected using the inspection apparatus. After a probe is connected to a plurality of test pads provided in each of the plurality of display cells DPC, a lighting test of each of the plurality of display cells DPC may be performed.

When the lighting test is performed after the plurality of display cells DPC are separated from the mother substrate MSUB by the cutting process, an additional process for removing the plurality of test pads is suitable after the lighting test is completed. On the other hand, when the lighting test is performed on the mother substrate MSUB, the plurality of test pads are removed later when the plurality of display cells DPC are separated from the mother substrate MSUB by laser irradiation and etching. Therefore, when the lighting test is performed on the mother substrate MSUB, there is an advantage that the separate additional process for removing the plurality of test pads is not required.

Figure 15:
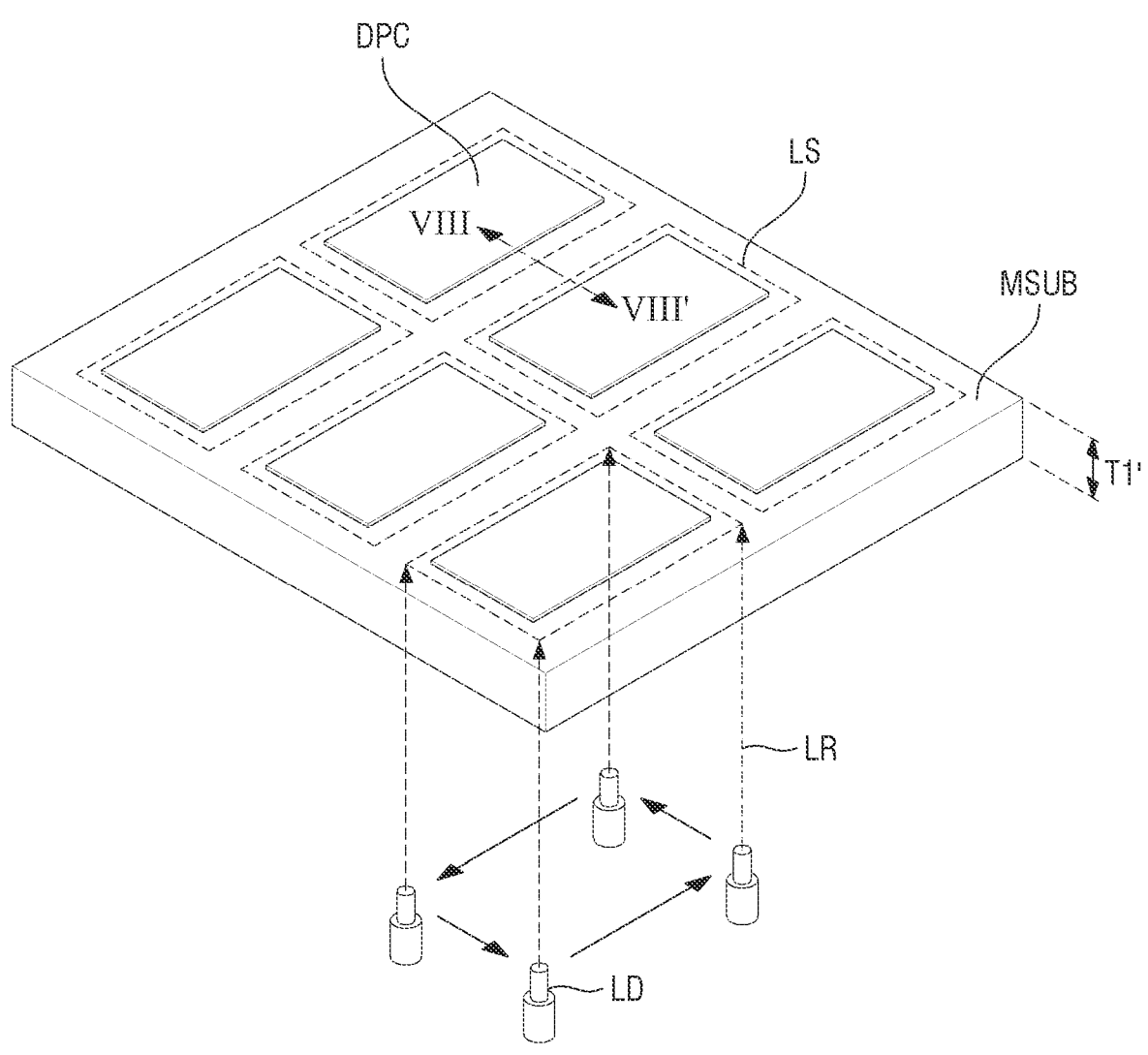
Figure 20:
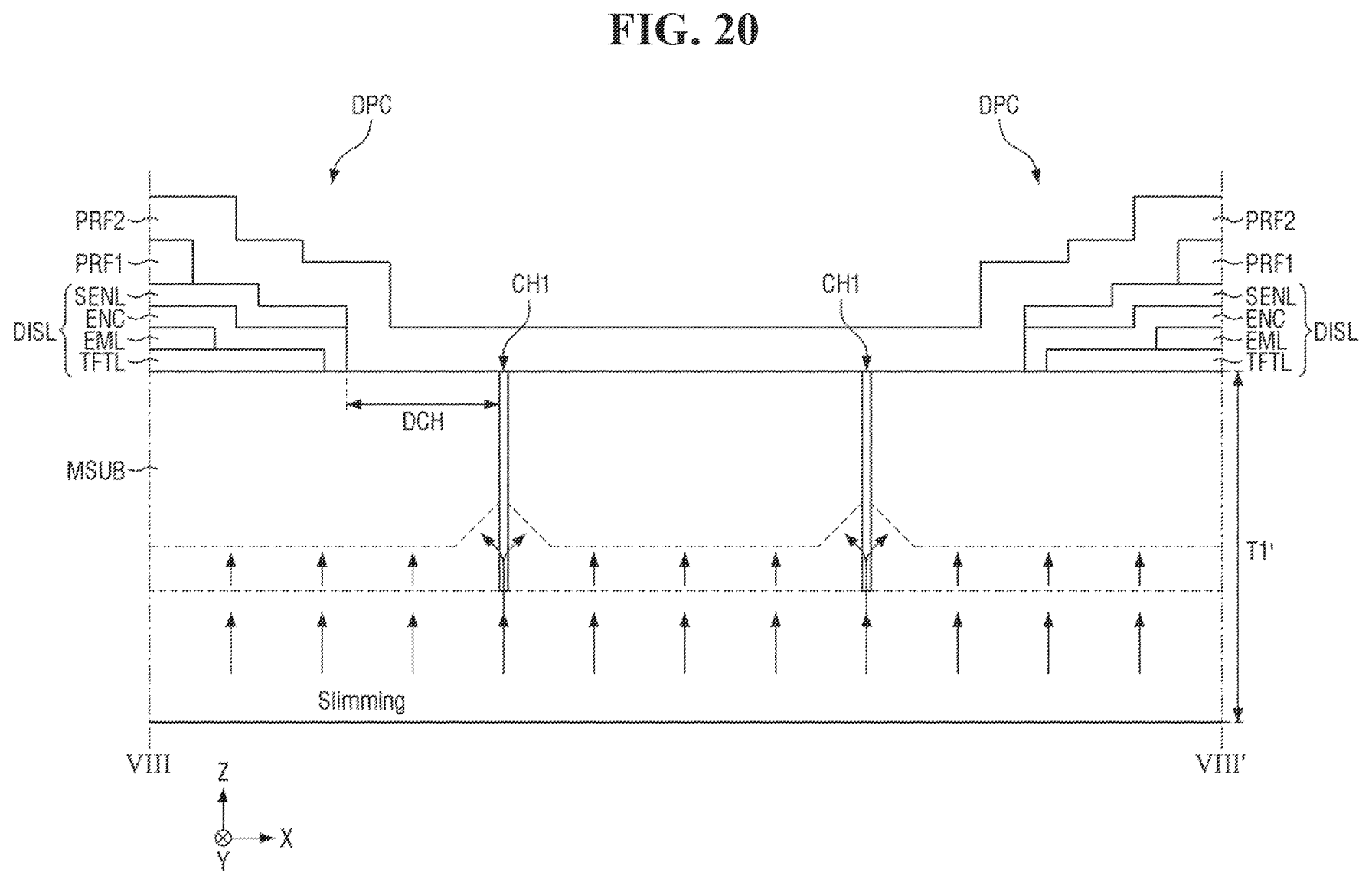

Next, as shown in FIGS. 15 and 20, the plurality of first cutting holes CH1 are formed along edges of the plurality of display cells DPC by the laser LR is irradiated on the second surface opposite to the first surface of the mother substrate MSUB.

The cutting line LS may be sketched by irradiating the laser LR to form the plurality of first cutting holes CH1 along edges of the plurality of display cells DPC. The cutting line LS may be formed along edges of the plurality of display cells DPC.

Various lasers may be used as the laser LR for sketching the cutting line LS. According to one or more embodiments, the laser LR may be an infrared-based Bessel beam having a wavelength of about 1030 nm.

The laser LR may be irradiated on the second surface of the mother substrate MSUB. However, the embodiments of the present specification are not limited thereto. The laser LR may be irradiated on the first surface of the mother substrate MSUB.

The tolerance on one side of the laser LR may be within about 50 μm, and the tolerance on both sides of the laser may be within about 100 μm. The unilateral tolerance of the laser LR may be a cutting error in one direction (e.g., the X-axis direction) when the first cutting holes CH1 are formed with the laser LR to sketch the cutting line LS.

The distance from the encapsulating layer ENC to the edge EG of the display panel 100 may be affected by the unilateral tolerance SE2 of the laser LR. When the laser LR is correctly irradiated to a position to be irradiated, the distance from the encapsulating layer ENC to the first cutting hole CH1 is defined as DCH.

When the laser LR is irradiated to the left by the maximum value of the unilateral tolerance of the laser LR, the distance from the encapsulating layer ENC to the first cutting hole CH1 may be DCH−SE2. In contrast, when the laser LR is irradiated to the right by the maximum value of the unilateral tolerance of the laser LR, the distance from the encapsulating layer ENC to the first cutting hole CH1 may be DCH+SE2.

Because the substrate SUB of the display cell DPC is separated from the mother substrate MSUB in the next operation, during the etching process, based on the first cutting hole CH1, the distance from the encapsulating layer ENC to the first cutting hole CH1 may be substantially the same as the minimum distance from the encapsulation layer ENC to the edge EG of the display panel 100 illustrated in FIG. 8. Therefore, the minimum distance from the encapsulating layer ENC to the edge EG of the display panel 100 in the display panel 100, in some cases, may be a difference of about 100 μm, which is a distance corresponding to unilateral tolerance×2 (or double-sided tolerance) of the laser LR.

The distance D1 from the encapsulating layer ENC to the edge EG of the display panel 100 may be DCH-SE2 to DCH+SE2 in the display panel 100 illustrated in FIG. 8. For example, when the distance DCH from the encapsulating layer ENC to the first cutting hole CH1 is about 50 μm and the unilateral tolerance of the laser LR is about 50 μm, the distance D1 from the encapsulating layer ENC to the edge EG of the display panel 100 may have a deviation of about 100 μm in the display panel 100 illustrated in FIG. 8 according to the unilateral tolerance of the laser LR in the range of 300 μm or less. The distance D1 to the edge EG of the display panel 100 may be a minimum of about 0 μm or a maximum of about 300 μm or less.

The one-side tolerance of the laser LR is about 50 μm, which may be less than the one-sided tolerance when the substrate SUB is cut using the cutting member. Because the tolerance on one side of the laser LR is less than the tolerance on one side of the cutting member, the distance from the encapsulating layer ENC to the edge EG of the display panel 100 may be reduced when cutting using the laser LR.

When the laser LR is irradiated on the second surface of the mother substrate MSUB, a depth (or sketch length) TCH1 of each of the plurality of first cutting holes CH1 formed by the laser LR may be adjusted by adjusting a repetition rate, a machining rate, and a pulse energy. For example, the depth TCH1 of each of the plurality of first cutting holes CH1 may be at least about 50 μm from the first surface of the mother substrate MSUB. Also, the mother substrate MSUB may have a thickness in a range of about 400 μm to about 600 μm. When the thickness of the mother substrate MSUB is about 500 μm, the depth TCH1 of each of the plurality of first cutting holes CH1 may be up to about 500 μm. That is, the depth TCH1 of each of the plurality of first cutting holes CH1 may be about 50 μm to about 500 μm from the first surface of the mother substrate MSUB.

The laser LR to form the first cutting holes CH1 may be irradiated with the repetition rate of about 10 kHz to about 250 kHz, the processing speed of about 10 mm/s to about 250 mm/s, and the pulse energy of about 10 μJ to about 300 μJ. However, it may be suitable to irradiate with the repetition rate of about 17.5 kHz to about 125 kHz, the processing speed of about 17.5 mm/s to about 125 mm/s, and the pulse energy of about 25 μJ to about 178 μJ in order for the laser LR to have the depth of about 225 μm from the first surface of the mother substrate MSUB.

Meanwhile, the drawing illustrates a case in which the first cutting hole CH1 is formed in the mother substrate MSUB by irradiation of the laser LR. However, the present disclosure is not limited thereto. The first cutting hole CH1 is not formed even when the laser LR is irradiated according to the intensity of the laser LR and the material of the mother substrate MSUB. Also, a laser irradiation area in which physical properties are changed may be formed in the area irradiated with the laser. As will be described later, the laser irradiation area may have a different etching rate than other portions in the etching process of the mother substrate MSUB and the same effect may be obtained when the first cutting hole CH1 is formed.

Figure 16:
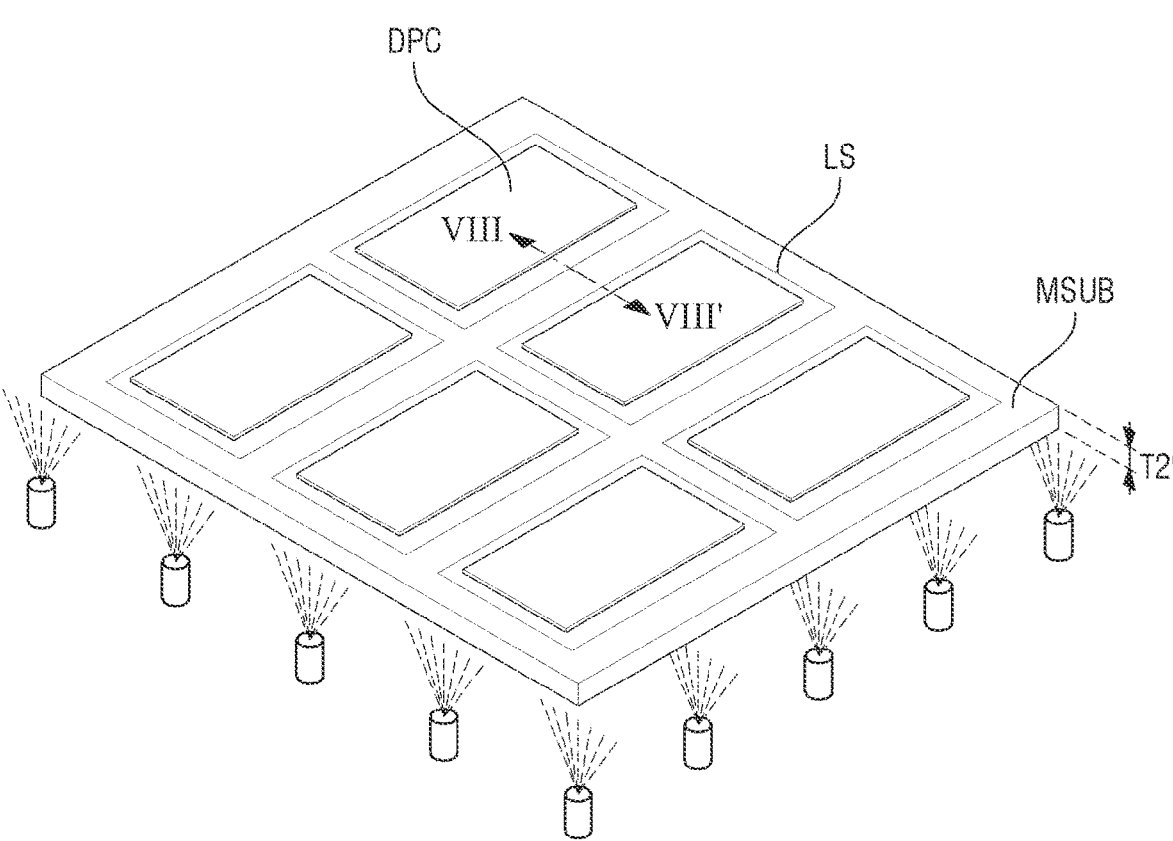
Figure 17:
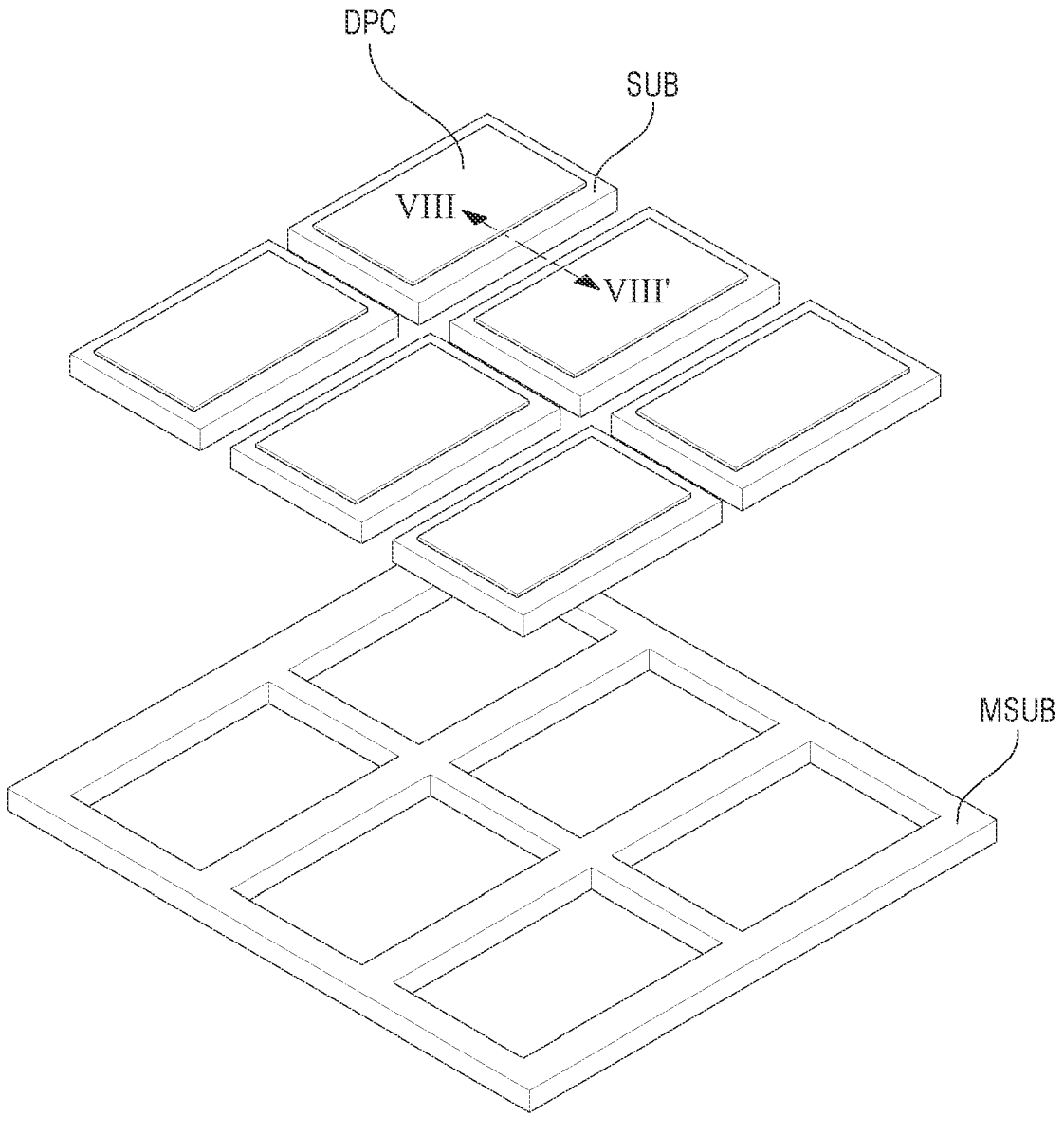
Figure 21:
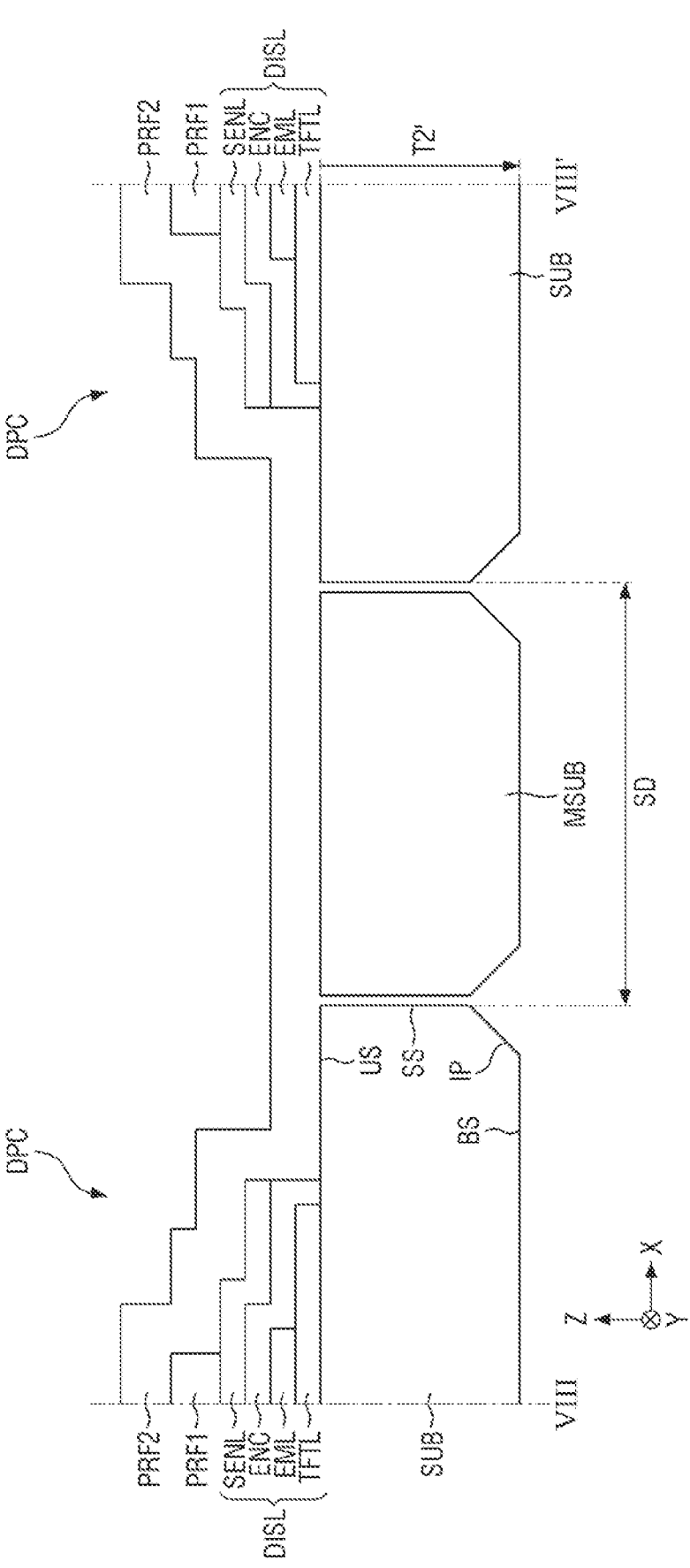

Next, as shown in FIGS. 16, 21, and 22, the second protective film PRF2 is attached on the plurality of first protective films PRF1 and the mother substrate MSUB is etched by spraying an etchant on the second surface of the mother substrate MSUB without a separate mask.

The second protective film PRF2 may be attached on the exposed mother substrate MSUB without being covered by the plurality of first protective films PRF1. The second protective film PRF2 may cover the first cutting holes CH1. The second protective film PRF2 may be the acid-resistant film for protecting the plurality of display cells DPC from the etchant in the etching process of the mother substrate MSUB to be performed in the next operation.

The mother substrate MSUB may be etched by spraying the etchant on the second surface without the separate mask. In the etching process using the etchant, the mother substrate MSUB may be cut along the plurality of first cutting holes CH1 while the thickness of the mother substrate MSUB is reduced.

When the etchant is sprayed on the second surface of the mother substrate MSUB, the mother substrate MSUB may be reduced from a first thickness T1' to a second thickness T2'. Because the mother substrate MSUB is etched without the separate mask, isotropic etching may be performed in which all areas of the second surface of the mother substrate MSUB are uniformly etched up to the area in which the first cutting holes CH1 are formed.

At this time, when the thickness of the mother substrate MSUB is decreased by the etchant, and when the etchant penetrates into the plurality of first cutting holes CH1 formed by the laser LR, a difference in etch rate may occur in an area in which the first cutting holes CH1 are formed and in an area in which the first cutting holes CH1 are not formed due to the presence of the plurality of first cutting holes CH1.

The mother substrate MSUB may have an increased surface area compared to an area not irradiated with the laser LR while the first cutting hole CH1 is formed in the area irradiated with the laser LR. As the area irradiated with the laser LR has a larger surface area than other areas, the etch rate may be faster by increasing the area in contact with the etchant. Also, in the area irradiated with the laser LR, the physical properties of the material of the mother substrate MSUB may change. A portion of the mother substrate MSUB irradiated with the laser LR may have a higher reactivity by the etchant than other portions and may have a faster etching rate.

Accordingly, the mother substrate MSUB may be aniso-tropically etched in which the etching rate in the area in which the first cutting holes CH1 is formed is faster than the etching rate in the area in which the first cutting holes CH1 are not formed. Accordingly, the substrate SUB separated from the mother substrate MSUB may include the inclined surface IP located between the side surface SS and the bottom surface BS.

In addition, as the etchant penetrates the plurality of first cutting holes CH1 formed by the laser LR, the mother substrate MSUB may be separated along the cutting line SL. That is, each of the plurality of display cells DPC may be separated from the mother substrate MSUB.

The first surface of the mother substrate MSUB is not penetrated by the etchant by the second protective film, whereas the second surface of the mother substrate MSUB is etched by the etching liquid. Accordingly, differences may occur between the first surface and the second surface of the mother substrate MSUB in roughness, hardness, light trans-mittance, light reflectance, local density, surface chemical structure, and the like. For example, dimples may occur due to the second etchant of the mother substrate MSUB.

On the other hand, the one-sided tolerance of the laser is about 50 μm, and the width of the first cutting hole CH1 formed by the laser LR may be expanded by about 40 μm by the etchant. Therefore, in consideration of the laser tolerance of each of the display cells DPC and the width of the first cutting hole CH1 extended by the etchant, a separation distance SD between the display cells DPC adjacent to each other is about 280 μm.

After the etching process is completed, the second protective film PRF2 may be detached.

Next, a process of forming the protective layers PL1 and PL2 on the outer surface of the substrate SUB separated from the mother substrate MSUB on which the display cell DPC is formed is performed.

Figure 23:
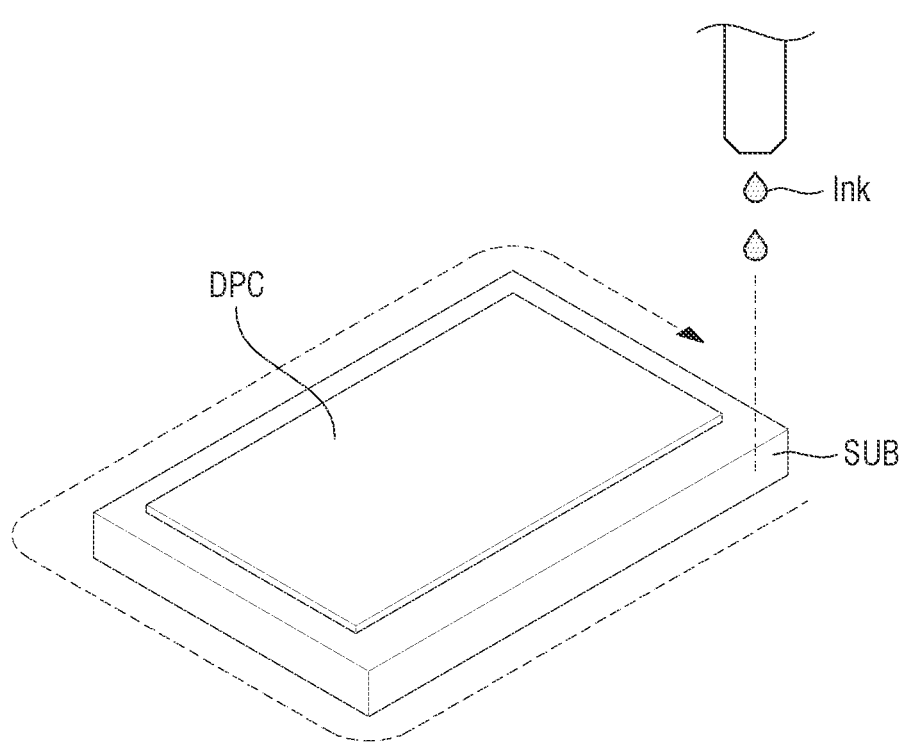
FIGS. 23 to 26 are perspective views illustrating a part of a manufacturing process of a display device according to one or more embodiments.
Figure 24:
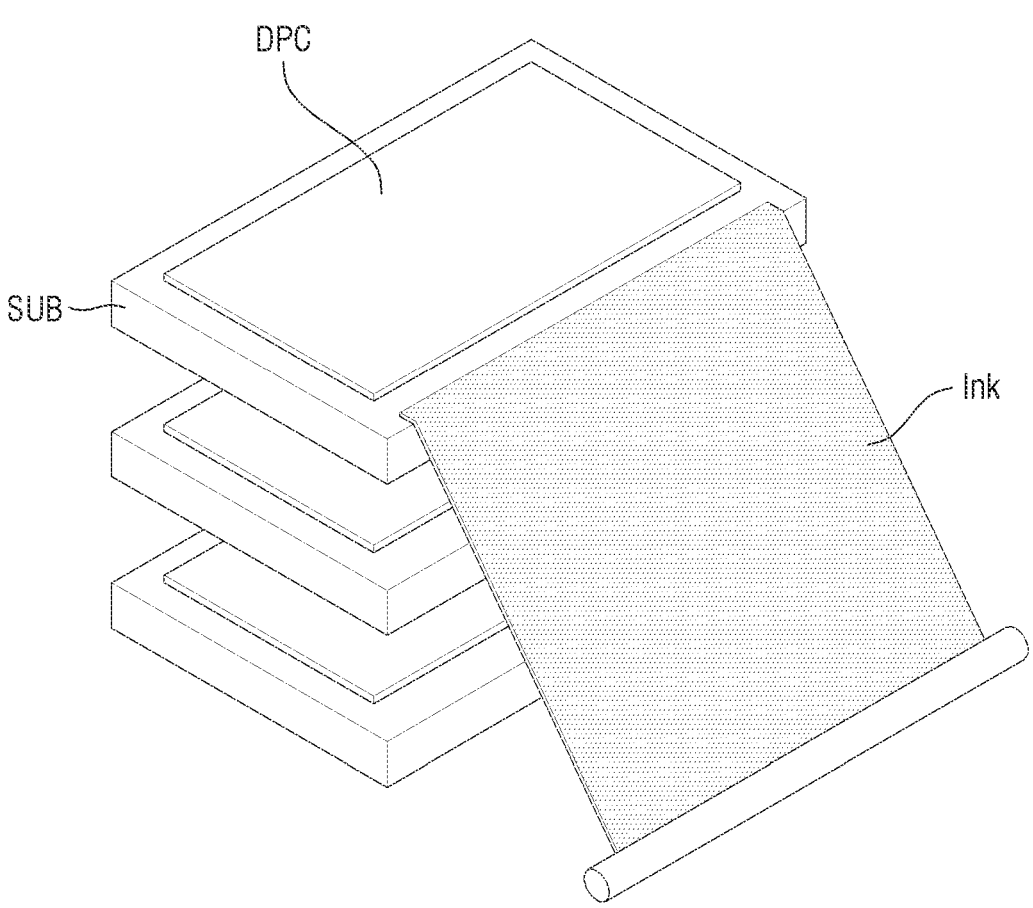
Figure 25:
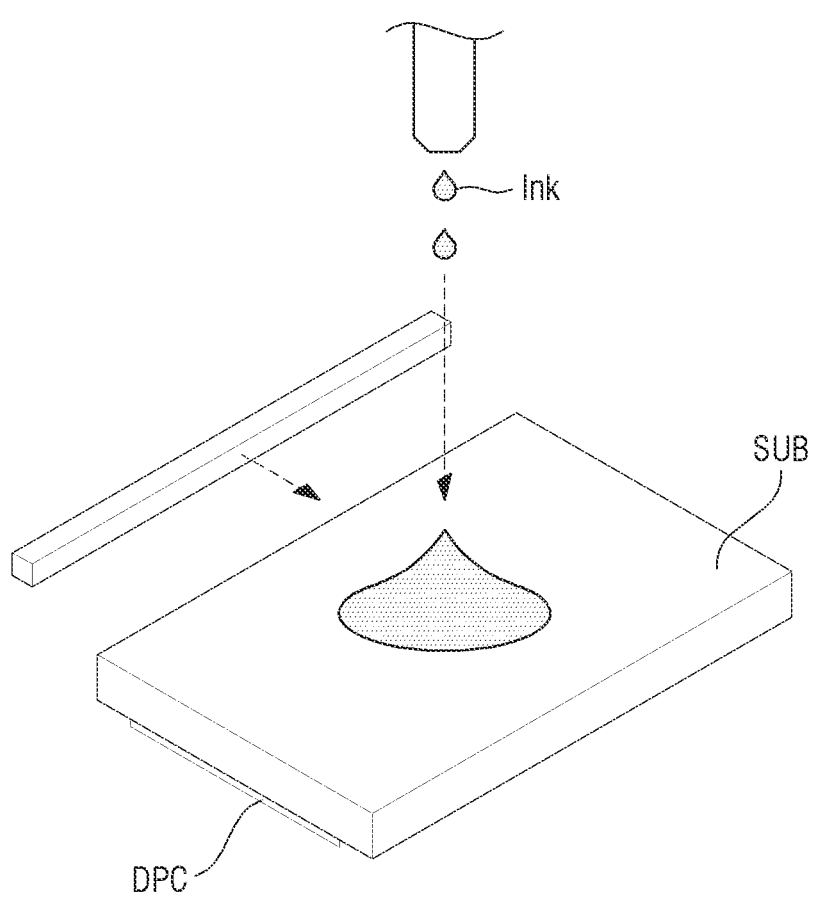
Figure 26:
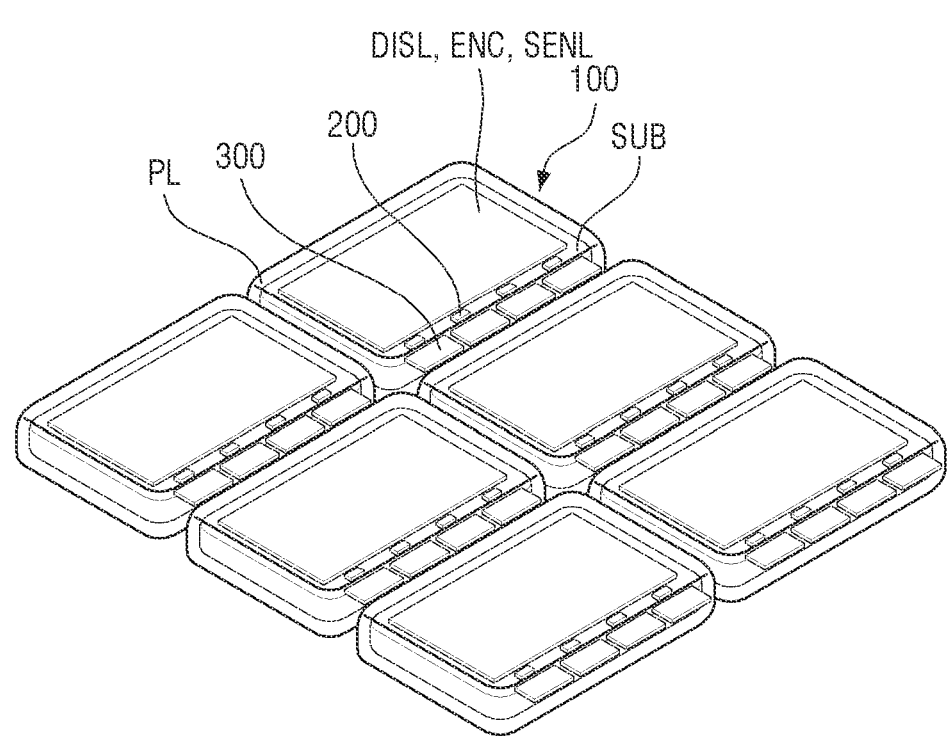

FIGS. 23 to 26 are perspective views illustrating a part of a manufacturing process of a display device according to one or more embodiments. FIGS. 23 to 25 respectively illustrate processes of forming the protective layers PL1 and PL2 formed on the outer surface of the substrate SUB and FIG. 26 illustrates a manufacturing process performed after the process of forming the protective layers PL1 and PL2.

Referring to FIG. 23, the process of forming the protective layers PL1 and PL2 may be performed by an inkjet printing process in the method of manufacturing the display device 10. A process of injecting ink including a material for forming the protective layers PL1 and PL2 along the outer surface of the substrate SUB may be performed after separating the plurality of substrates SUB from the mother substrate MSUB in the method of manufacturing the display device 10 according to one or more embodiments. The protective layers PL1 and PL2 may be located on at least one of the side surface SS, the first inclined surface IP1, and the bottom surface BS of the substrate SUB of the display panel

100 in the display device 10. The side surface SS and the first inclined surface IP1 of the substrate SUB of the display panel 100 may have a smaller surface area than the bottom surface BS, and a method of directly spraying a material forming the protective layers PL1 and PL2 on the side surface SS and the first inclined surface IP1 may be suitable.

The protective layers PL1 and PL2 may include a polysiloxane-based polymer material, and may be a material that is cured by UV irradiation. Accordingly, the protective layers PL1 and PL2 may have fluidity before being cured, and may be directly sprayed onto the substrate SUB of the display panel 100 through an inkjet printing apparatus. The inkjet printing apparatus may directly eject the ink Ink onto the outer surface of the substrate SUB while moving along the outer surface of the substrate SUB.

As shown in FIGS. 8 and 9, in the embodiments in which the protective layers PL1 and PL2 are formed on the first inclined surface IP1 and the bottom surface BS of the substrate SUB, the ink Ink including the material of the protective layers PL1 and PL2 may be directly sprayed onto the inclined surface IP and the bottom surface BS of the separated substrate SUB. Subsequently, in one or more embodiments, UV is irradiated to the ejected ink to cure it, and the first protective layer PL1 and the second protective layer PL2 may be formed.

In one or more other embodiments, when the protective layers PL1 and PL2 are located on the side surface SS of the substrate SUB of the display panel 100, the ink Ink including the material of the protective layers PL1 and PL2 may be directly sprayed onto the side surface SS of the separated substrate SUB.

However, the process of forming the protective layers PL1 and PL2 in the manufacturing process of the display device 10 is not necessarily limited to the inkjet printing process. Various processes may be applied to a method of spraying or applying the ink Ink to form the protective layers PL1 and PL2.

Referring to FIG. 24, in the method of manufacturing the display device 10, the process of forming the protective layers PL1 and PL2 may be concurrently or substantially simultaneously performed on the plurality of substrates SUB. In the one or more embodiments corresponding to FIG. 23, the process of injecting ink Ink onto one substrate SUB may be performed using the inkjet printing apparatus. However, the plurality of substrates SUB are stacked, and ink Ink including a material of the protective layers PL1 and PL2 is concurrently or substantially simultaneously applied to the side surfaces SS or the inclined surfaces IP thereof in the manufacturing method of the display device 10 to improve product productivity.

As the plurality of substrates SUB are stacked, the apparatus for applying the ink Ink may apply the ink Ink while moving along the extending directions of upper, bottom, and left and right corners of the substrate SUB. For example, the apparatus for applying the ink Ink may apply the ink Ink to the side surface SS or to the inclined surface IP of the substrate SUB while moving in the first direction (X-axis direction) or in the second direction (Y-axis direction).

However, as the plurality of substrates SUB are stacked, it may not be easy to apply the ink Ink to the bottom surface BS of the substrate SUB. In this case, the separate process of applying ink to the bottom surface BS of the substrate SUB may be performed.

Referring to FIG. 25, in the method of manufacturing the display device 10, the process of forming the protective layers PL1 and PL2 sprays a large amount of ink on the bottom surface of the substrate SUB, and may include a process of applying this to the entire surface of the bottom surface BS of the substrate SUB. Because the area of the bottom surface BS is relatively larger than that of the side surface SS and the inclined surface IP of the substrate SUB, the process of applying a material to a large area may be performed accordingly. Although the drawing shows the process using the apparatus for spraying ink on the bottom surface BS of the substrate SUB and then applying the ink, the present disclosure is not limited thereto. In some embodiments, the process of forming the protective layers PL1 and PL2 may be performed as a slot die coating process.

Next, referring to FIG. 26, the display device 10 may be manufactured by attaching the driving IC 200 and the circuit board 300 to each of the plurality of display cells DPC, and by attaching the polarizing film PF and the cover window CW after detaching the first protective film PRF1 from each of the plurality of display cells DPC.

Because the method of manufacturing the display device 10 according to one or more embodiments performs the separation process of the mother substrate MSUB, the width between the display cells DPC of the display panel 100 and the edge of the display panel 100 may be reduced or minimized as compared to the manufacturing method using the cutting member. That is, the display device 10 may reduce or minimize unnecessary space remaining in the outermost portion of the display panel 100. In addition, the method of manufacturing the display device 10 may increase the efficiency of the manufacturing process because the thickness of the mother substrate MSUB may be reduced by using the etching process, and the substrate SUB of each of the plurality of display cells DPC may be separated from the mother substrate MSUB.

In addition, the display device 10 may include protective layers PL1 and PL2 for protecting the substrate SUB of the display panel 100, and whose mechanical strength may be weakened by the laser LR irradiation process and the etching process. The protective layers PL1 and PL2 may be located on at least one of the side surface SS, the inclined surface IP, and the bottom surface BS of the substrate SUB, and the structure of the substrate SUB and the mechanical strength weakened by deformation in the manufacturing process may be compensated. The display device may reduce or minimize the unnecessary area of the display panel 100 and secure strong mechanical strength.

Meanwhile, the laser LR may be formed such that the plurality of first cutting holes CH1 are arranged along a curve when viewed from a plane by adjusting repetition rate, machining rate, and pulse energy. For example, corners of each of the plurality of display cells DPC may be formed in a round shape having a curvature by forming the plurality of first cutting holes CH1 in a curved shape, and then by etching by spraying the etchant along the plurality of first cutting holes CH1. Because corners of each of the plurality of display cells DPC may be formed in the round shape without a separate polishing process in the method of manufacturing the display device 10, the efficiency of the manufacturing process may be increased.

Hereinafter, various embodiments of the display device 10 will be described with reference to other drawings.

Figure 27:
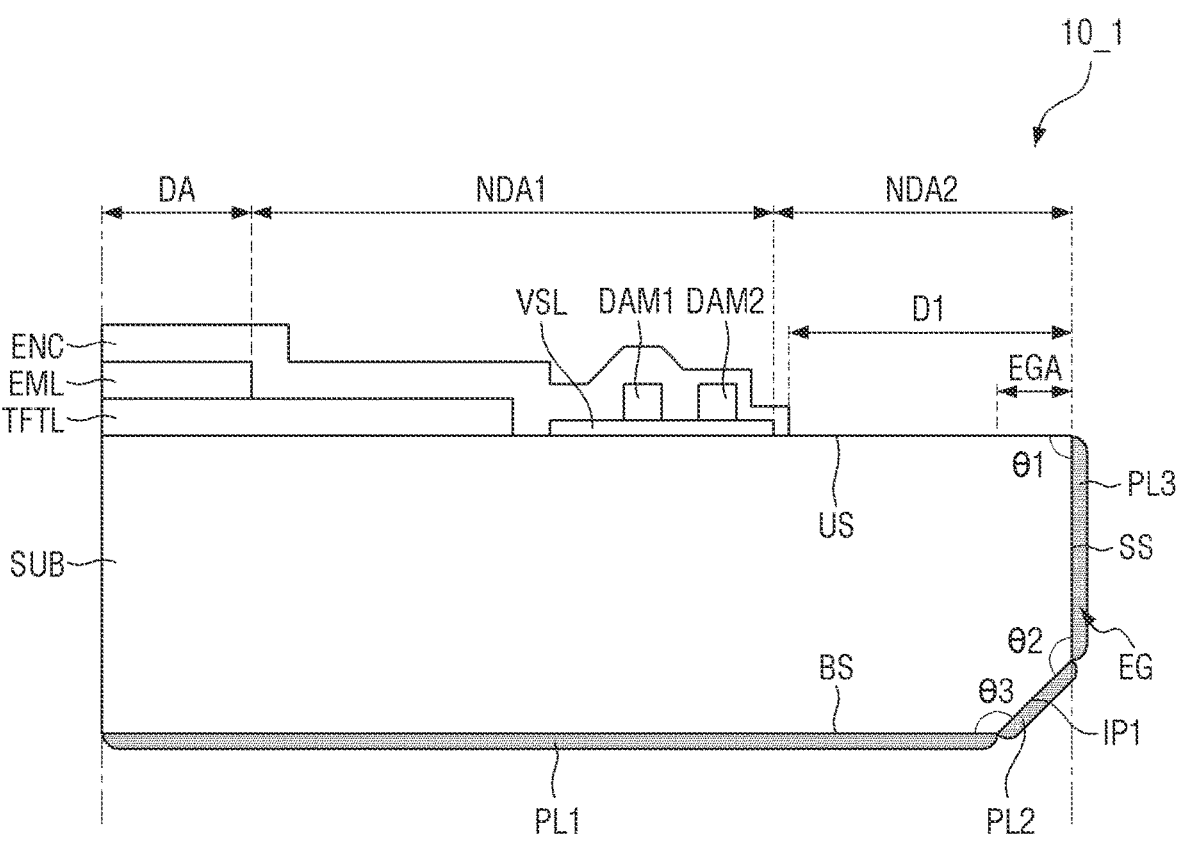
FIGS. 27 and 28 are cross-sectional views illustrating a part of a display device according to one or more other embodiments.
Figure 28:
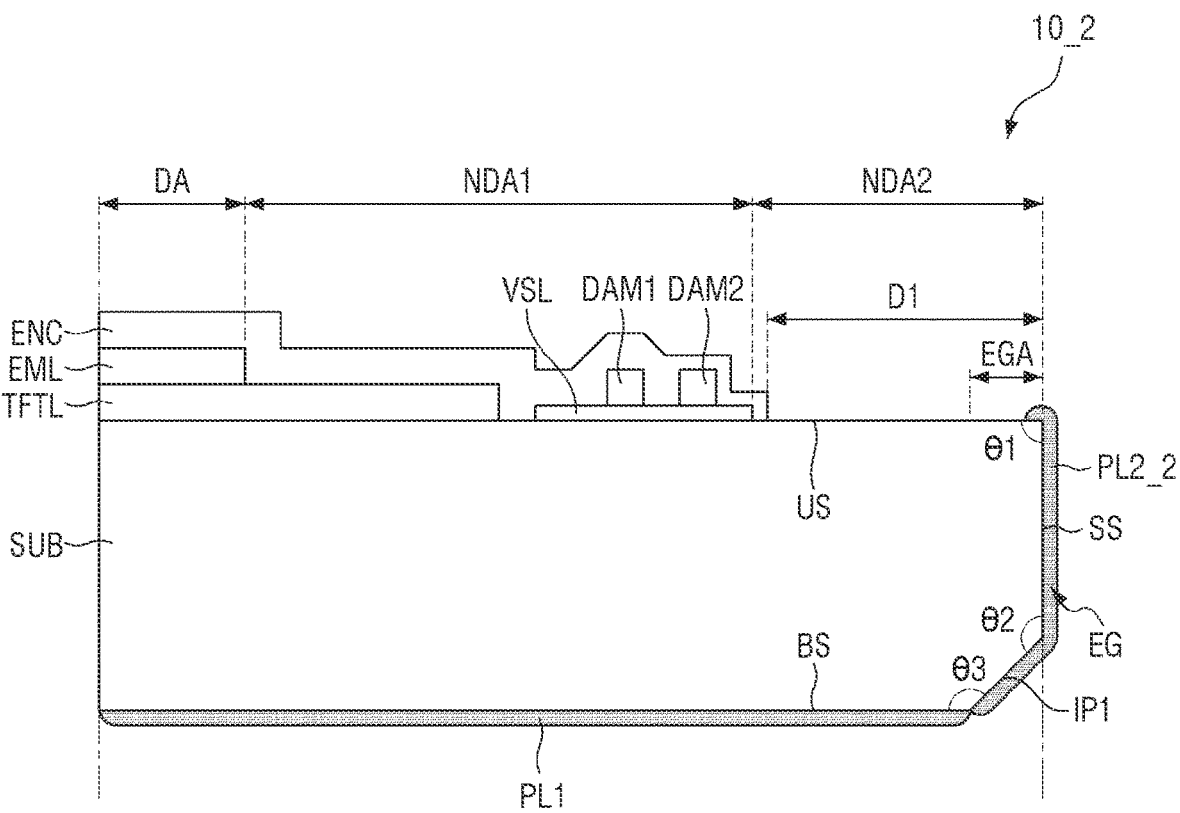

FIGS. 27 and 28 are cross-sectional views illustrating a part of a display device according to one or more other embodiments.

Referring to FIG. 27, protective layers PL1, PL2, and PL3 may also be located on the side surface SS of the substrate SUB of the display panel 100 in the display device 10_1 according to one or more embodiments. During the manufacturing process of the display device 10_1, a process of irradiating the laser LR to the mother substrate MSUB and etching the same may be performed. The bottom surface BS and the first inclined surface IP1 of the substrate SUB of the display panel 100 may be areas etched by the etchant, and the side surfaces SS of the substrate SUB may be areas directly irradiated with the laser LR. Accordingly, the mechanical strength of the side surface SS of the substrate SUB may be somewhat lowered due to thermal deformation by the laser LR, and the display device 10_1 may further include protective layers PL1, PL2, and PL3 located on the side surface SS of the substrate SUB of the display panel 100 to improve mechanical strength.

The display device 10_1 may include the first protective layer PL1 located on the bottom surface BS of the substrate SUB, the second protective layer PL2 located on the first inclined surface IP1, and the third protective layer PL3 located on the side surface SS. The first protective layer PL1, the second protective layer PL2, and the third protective layer PL3 may include the same material as each other, but might not be integrated with each other because they are formed through separate processes. For example, the first protective layer PL1 may be formed by the process shown in FIG. 25, and the second protective layer PL2 and the third protective layer PL3 may be formed by the process shown in FIG. 23 or 24, respectively. However, the present disclosure is not limited thereto, and at least some or all of the first protective layer PL1, the second protective layer PL2, and the third protective layer PL3 may be concurrently or substantially simultaneously formed and integrated with each other.

Referring to FIG. 28, in a display device 10_2 according to one or more embodiments, the protective layer on the first inclined surface IP1 and the side surface SS may be integrated with each other. A second protective layer PL2_2 may cover the side surface SS and the first inclined surface IP1. In one or more embodiments, the display device 10_2 may include the first protective layer PL1 located on the bottom surface BS of the substrate SUB of the display panel 100, the side surface SS of the substrate SUB, the first inclined surface IP1, and the second protective layer PL2_2 located on a portion of the upper surface US. The second protective layer PL2_2 may be formed through the process illustrated in FIG. 23 or FIG. 24 and may be concurrently or substantially simultaneously located on the side surface SS and the first inclined surface IP1 of the substrate SUB according to the amount and position where the ink Ink is sprayed or applied.

In addition, a portion of the second protective layer PL2_2 may cover the edge area EGA of the upper surface US of the substrate SUB. As described above, the angle θ1 between the side surface SS and the upper surface UP of the substrate SUB of the display panel 100 may be about 90°. That is, the angle between the side surface SS and the upper surface UP of the substrate SUB may be substantially close to a right angle. The display panel 100 may be vulnerable to the external impact applied to a corner where the upper surface US and the side surface SS of the substrate SUB meet, and the second protective layer PL2_2 may cover the edge where the upper surface US and the side surface SS meet to compensate for this. A portion of the second protective layer PL2_2 may be located on the upper surface US of the substrate SUB to completely cover the corner and this portion may overlap the edge area EGA of the display panel 100. In one or more embodiments, the second protective layer PL2_2 may cover the processing traces formed in the edge area EGA of the display panel 100 in the display device 10_2.

Figure 29:
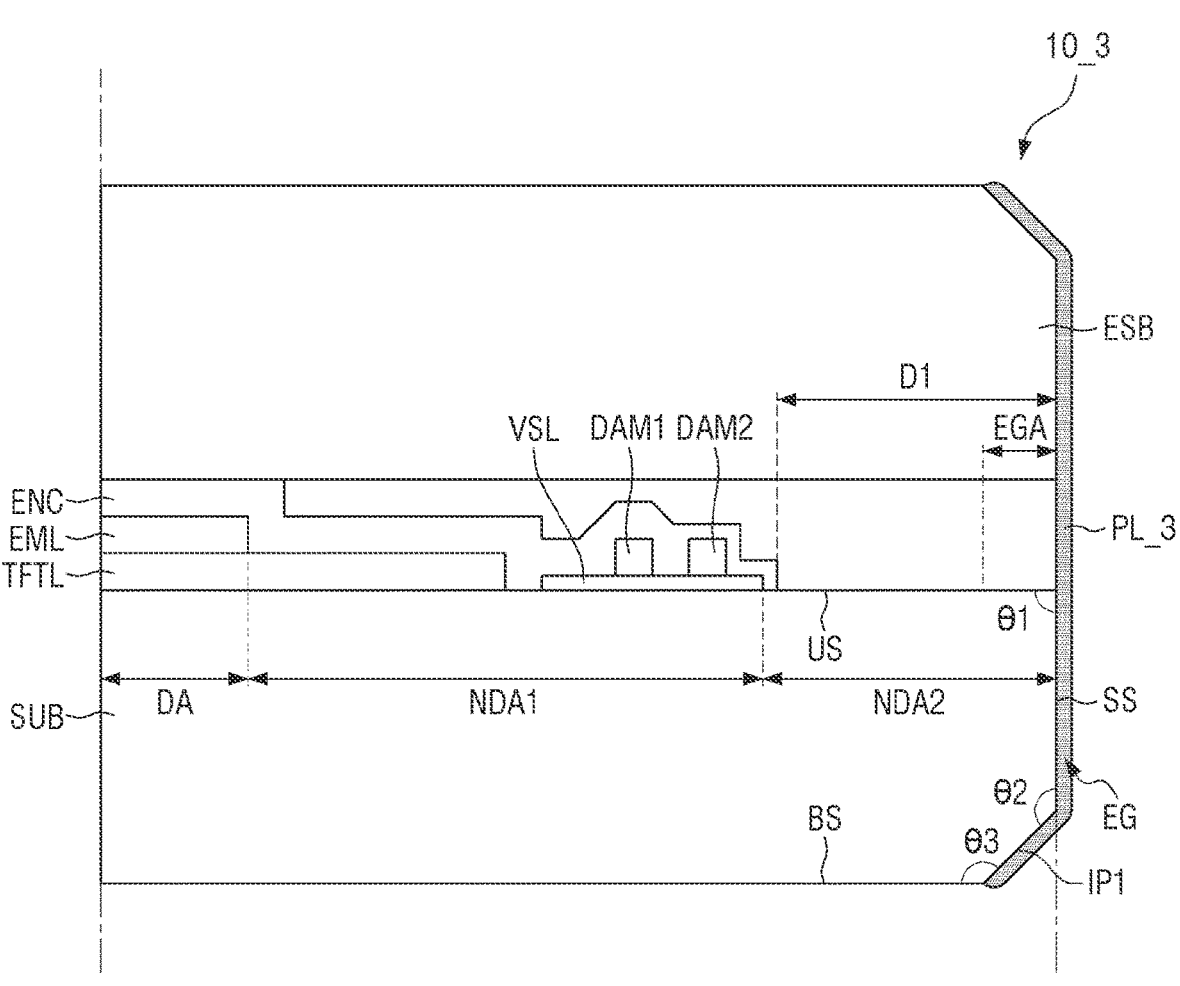
FIGS. 29 and 30 are cross-sectional views illustrating a part of a display device according to one or more other embodiments.
Figure 30:
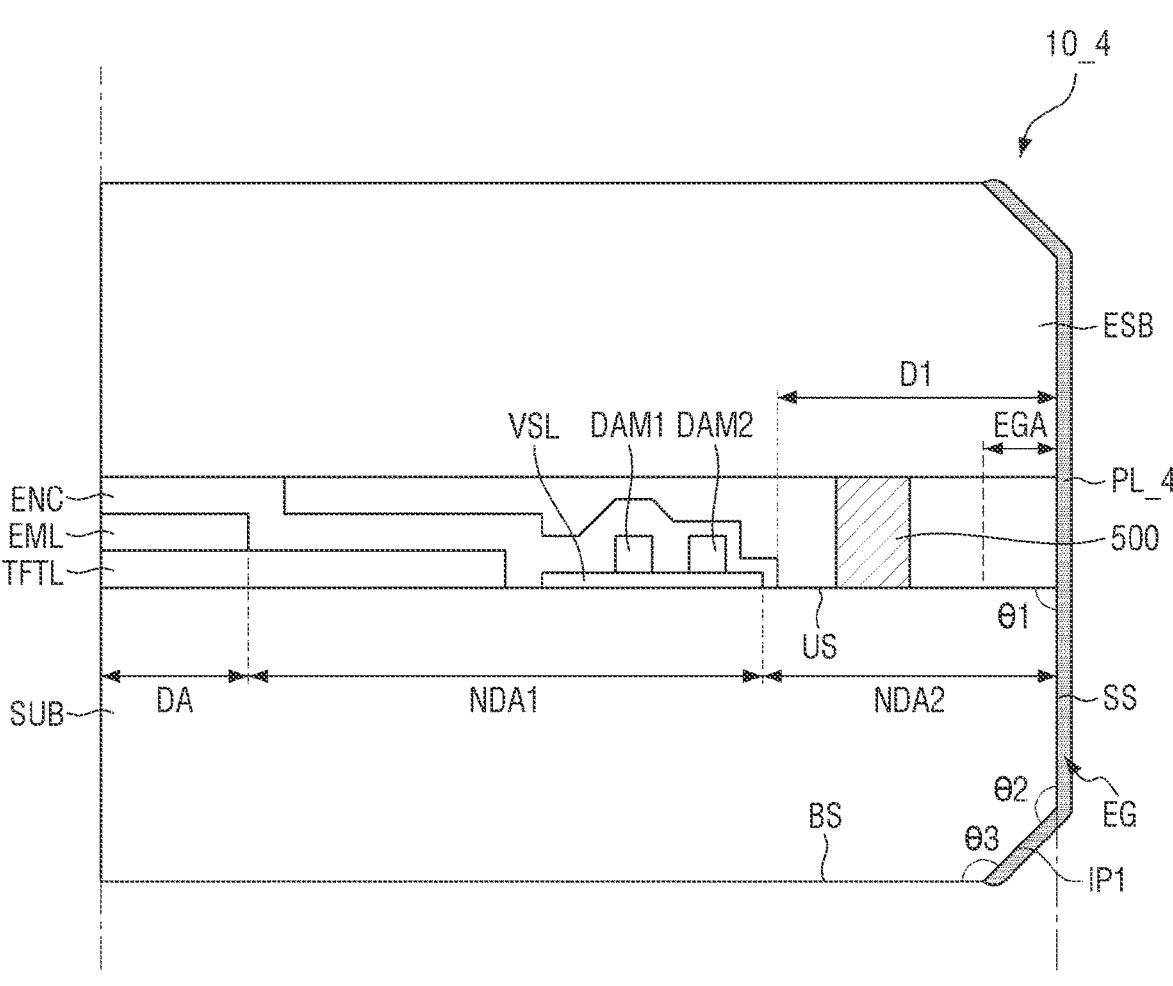

FIGS. 29 and 30 are cross-sectional views illustrating a part of a display device according to one or more other embodiments.

Referring to FIG. 29, a display device 10_3 according to one or more embodiments further includes an encapsulating substrate ESB located on the encapsulating layer ENC, and a protective layer PL_3 may be located over the side surface of the encapsulating substrate ESB, the side surface SS of the substrate SUB, and the first inclined surface IP1. The display device 10_3 is directly located on the encapsulating layer ENC, and may further include the encapsulating substrate ESB for protecting the upper surface of the display panel 100. The protective layer PL_3 may protect the encapsulating substrate ESB and the substrate SUB from impacts applied from the side surfaces of the encapsulating substrate ESB and the substrate SUB.

The encapsulating substrate (ESB, or the second substrate) is located on the display panel 100. For example, the encapsulating substrate ESB may face, or may be opposite to, the substrate SUB of the display panel 100 in the third direction (Z-axis direction), and may have a planar area substantially the same as that of the display panel 100 and may cover the display panel 100. However, the present disclosure is not limited thereto. The encapsulating substrate ESB may have the planar area that is less than that of the display panel 100, but may cover at least the display area DA of the display panel 100. The encapsulating substrate ESB may encapsulate the light-emitting element layer EML and circuit elements located on the display panel 100. In addition, in some embodiments, a touch member, a polarizing member, etc. may be further located on the encapsulating substrate ESB.

In one or more embodiments, the encapsulating substrate ESB may be a transparent plate or a transparent film. For example, the encapsulating substrate ESB may include a glass material, a quartz material, or the like. However, the present disclosure is not limited thereto.

The protective layer PL_3 may be located on the side surface SS and the first inclined surface IP1 of the substrate SUB, and on the side surface and the inclined surface of the encapsulating substrate ESB. The protective layer PL_3 may be formed as one layer by integrating a portion located on the substrate SUB and a portion located on the encapsulating substrate ESB. Accordingly, a portion of the protective layer PL_3 may not contact the encapsulating substrate ESB and the substrate SUB in a space between them, respectively. However, the present disclosure is not limited thereto. The protective layer PL_3 may be separated into a portion located on the encapsulating substrate ESB and a portion located on the substrate SUB.

Referring to FIG. 30, a display device 10_4 according to one or more embodiments further includes the encapsulating substrate ESB located on the encapsulating layer ENC, and a sealing material 500 located between the encapsulating substrate ESB and the substrate SUB. Further, a protective layer PL_4 may be located over the side surface of the encapsulating substrate ESB, and over the side surface SS and the first inclined surface IP1 of the substrate SUB. The display device 10_4 according to the presently described embodiments is different from the one or more embodiments corresponding to FIG. 29 in that the encapsulating substrate ESB may be spaced apart from the encapsulating layer ENC, and is bonded to the substrate SUB by the sealing material 500.

The sealing material 500 may be located between the display panel 100 and the encapsulating substrate ESB. For example, the sealing material 500 may be located in the non-display area NDA of the display panel 100 to surround the display area DA, and may encapsulate the light-emitting element layer EML and circuit elements of the display panel 100 together with the encapsulating substrate ESB. The sealing material 500 may seal the space between the encapsulating substrate ESB and the display panel 100, and the space may exist in a vacuum state by removing moisture or air during the manufacturing process of the display device 10. The sealing material 500 may reduce or prevent damage to the light-emitting element layer EML due to air or moisture together with the encapsulating substrate ESB.

The sealing material 500 may combine the display panel 100 and the encapsulating substrate ESB to each other. The sealing material 500 may be located in the non-display area NDA of the display panel 100 to be coupled to the upper surface US of the substrate SUB of the display panel 100 and to the bottom surface of the encapsulating substrate ESB.

In some embodiments, the sealing material 500 may be a cured frit. In the present specification, frit may refer to a structure having glass properties formed by melt-hardening powder in the form of a glass optionally added with an additive. The powder-type glass may be located between the display panel 100 and the encapsulating substrate ESB, and then may go through a firing and melting process to form the frit for combining the display panel 100 and the encapsulating substrate ESB to each other.

Other than that, descriptions of other parts are the same as those described above with reference to FIG. 30, and thus detailed descriptions will be omitted.

Figure 31:
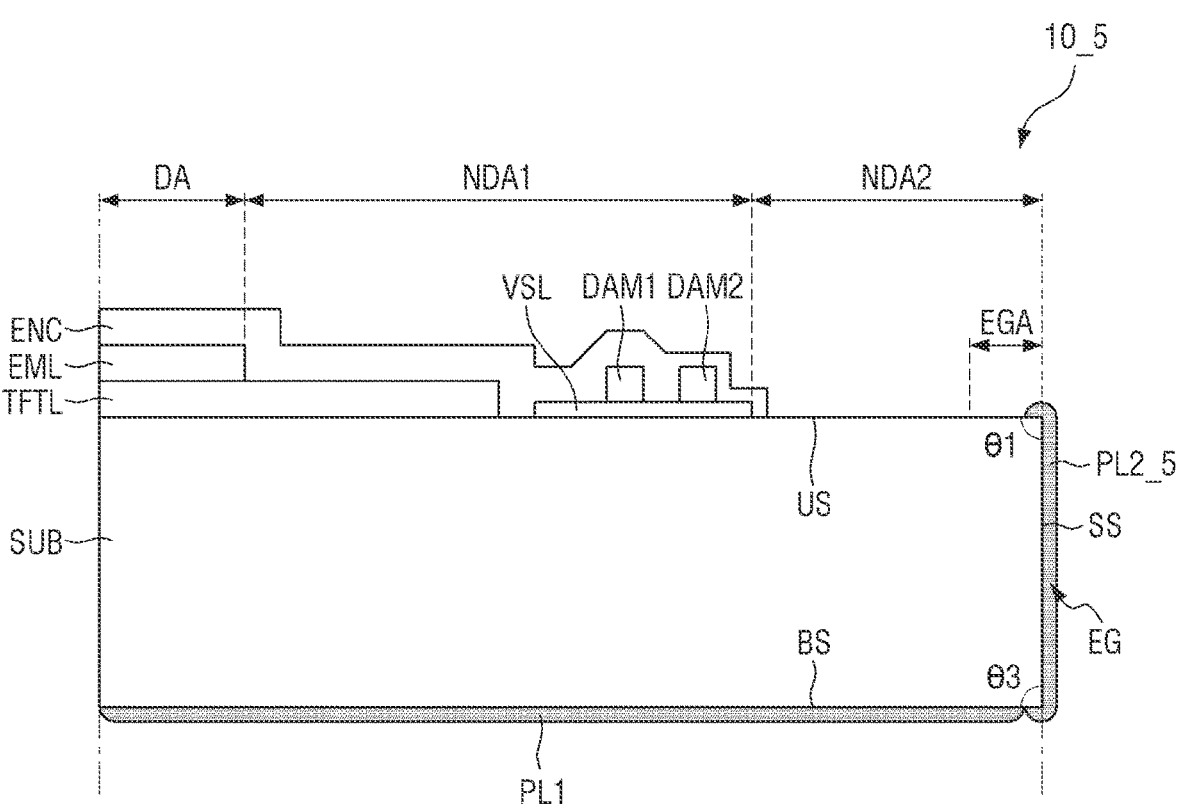
FIG. 31 is a cross-sectional view illustrating a part of a display device according to one or more other embodiments.

FIG. 31 is a cross-sectional view illustrating a part of a display device according to one or more other embodiments.

Referring to FIG. 31, in a display device 10_5 according to one or more embodiments, the substrate SUB of the display panel 100 does not include the first inclined surface IP1, and instead may include only the upper surface US and the bottom surface BS parallel to the first direction (X-axis direction) or the second direction (Y-axis direction), along with the side surface SS parallel to the third direction (Z-axis direction). The protective layers PL1 and PL2_5 may include the first protective layer PL1 located on the bottom surface BS of the substrate SUB and may include the second protective layer PL2_5 located over a portion of the upper surface US, the side surface SS, and a portion of the bottom surface BS of the substrate SUB.

As described above, a process of irradiating the laser and the etching process may be performed in the process of separating the substrate SUB from the mother substrate MSUB in the display device 10. However, if the mother substrate MSUB may be cut only by the process of irradiating the laser, the etching process may be omitted. In this case, the substrate SUB of the display panel 100 has a shape in which the side surface SS is parallel to the third direction (Z-axis direction), and the inclined surface between the side surface SS and the bottom surface BS may be omitted. In the display panel 100, an angle θ3 between the bottom surface BS and the side surface SS of the substrate SUB may be about 90°.

The protective layers PL1 and PL2_5 may include the first protective layer PL1 that relieves an impact applied to the bottom surface BS of the substrate SUB and the second protective layer PL1 that relieves an impact applied to the side surface SS of the substrate SUB. Because the side surface SS of the substrate SUB has respective angles 81 and 83 formed with the upper surface US and the bottom surface BS that are around 90°, the second protective layer PL2_5 may cover corners formed by the side surface SS, the upper surface US, and the bottom surface BS of the substrate SUB.

A portion of the second protective layer PL2_5 may be directly located on the upper surface US and the bottom surface BS, and may overlap at least a portion of the edge area EGA. Accordingly, the second protective layer PL2_5 may cover the processing marks remaining in the edge area EGA of the display panel 100.

In the display device 10_5, as the etching process is omitted from the manufacturing process, the manufacturing process may be shortened, and productivity may be improved. In addition, the display device 10_5 includes the protective layers PL1 and PL2_5 to reduce or prevent a decrease in mechanical strength according to a change in the manufacturing process.

Figure 32:
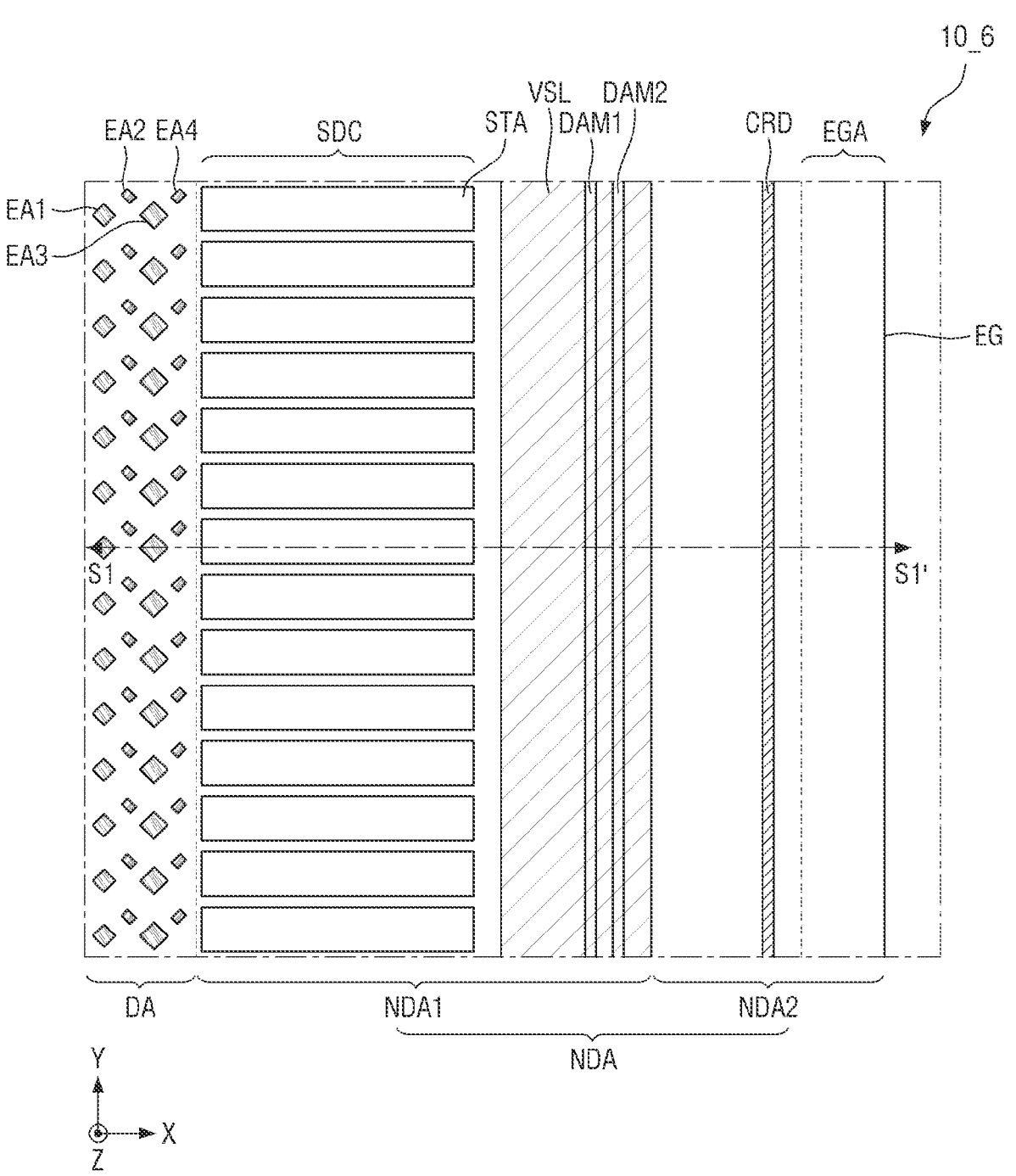
FIG. 32 is a layout diagram illustrating an enlarged partial area of a display panel according to one or more other embodiments.
Figure 33:
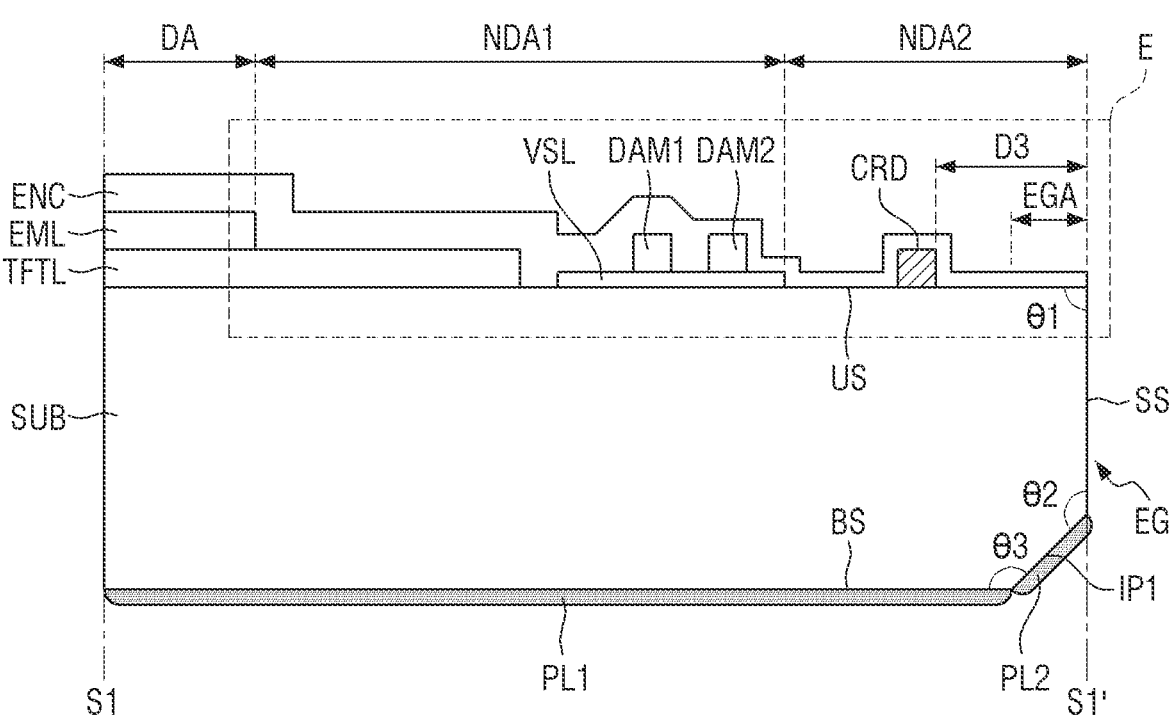
FIG. 33 is a cross-sectional view illustrating a display panel taken along the line S1-S1' of FIG. 32, according to one or more embodiments.
Figure 34:
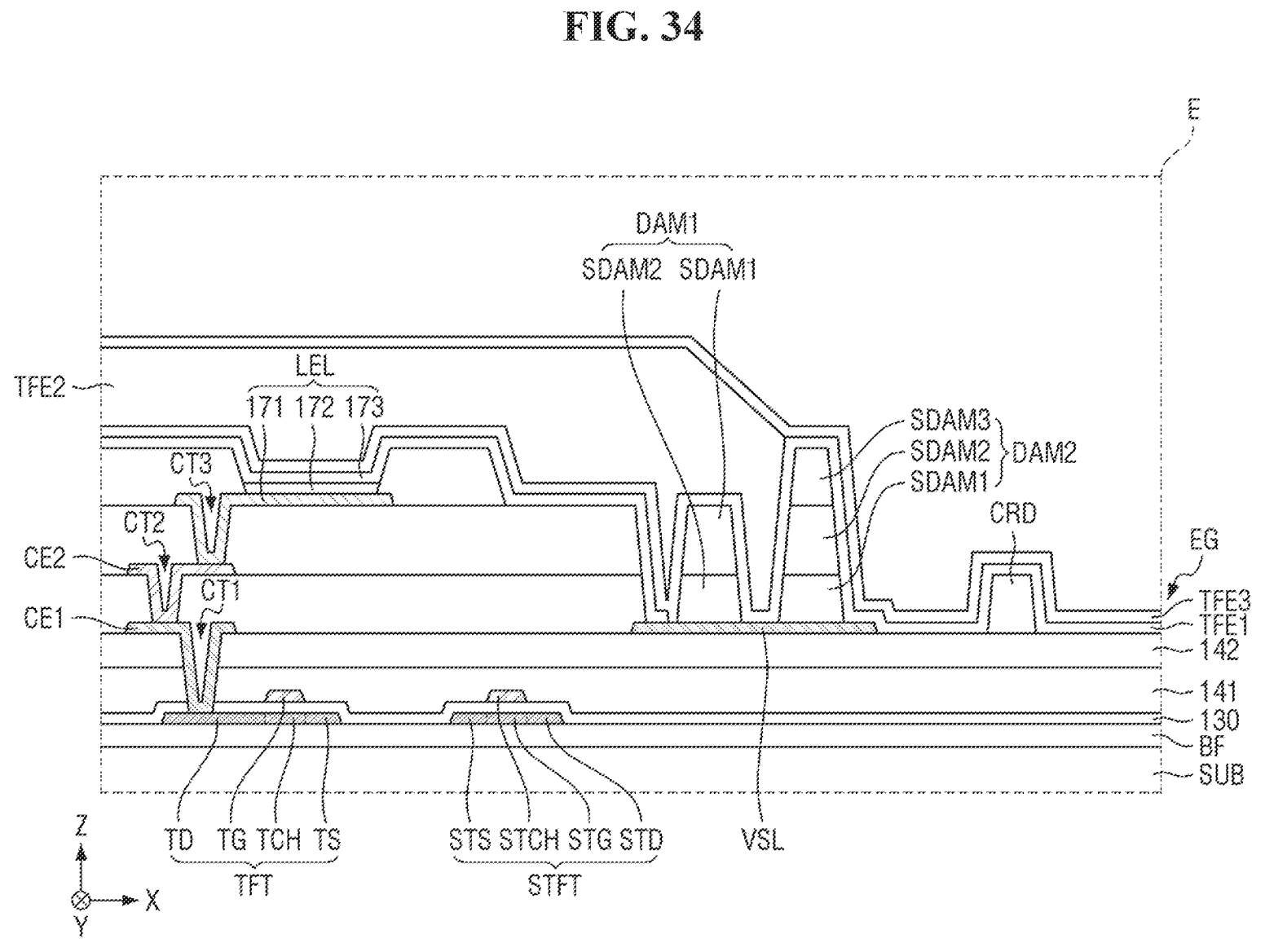

FIG. 32 is a layout diagram illustrating an enlarged partial area of a display panel according to one or more other embodiments. FIG. 33 is a cross-sectional view illustrating a display panel taken along the line S1-S1' of FIG. 32, according to one or more embodiments. FIG. 34 is a cross-sectional view illustrating area E of FIG. 33 in more detail.

Referring to FIGS. 32 to 34, a display device 10_6 according to one or more embodiments may further include the crack dam CRD located at an outer portion of the display panel 100.

The crack dam CRD may be a structure for reducing or preventing the likelihood of cracks occurring in the process of cutting the substrate SUB during the manufacturing process of the display device 10. The crack dam CRD may be the outermost structure located on the outermost side of the display panel 100. The crack dam CRD may surround the second dam DAM2 at the outermost area of the display panel 100. For example, the crack dam CRD may extend in the second direction (Y-axis direction) in the non-display area NDA on the side of the display panel 100. The crack dam CRD may be located closer to the edge EG than the second dam DAM2 in the second non-display area NDA2, and may be located between the second dam DAM2 and the edge area EGA.

The crack dam CRD may include the same material as the first organic layer 160, and may be located on/at the same layer. The crack dam CRD may be located on the second interlayer insulating layer 142. The crack dam CRD may be formed of an organic film, such as acryl resin, epoxy resin, phenolic resin, polyamide resin, polyimide resin, etc. In one or more embodiments, the width of the crack dam CRD may be about 30 μm or less.

FIG. 32 illustrates that the crack dam CRD includes one organic layer, but is not limited thereto. For example, the crack dam CRD may further include another organic layer including the same material as the second organic layer 180. Alternatively, the crack dam CRD may further include another organic layer including the same material as the bank 190. Alternatively, the crack dam CRD may further include another organic layer including the same material as the spacer 191.

Along with the arrangement of the crack dam CRD, the arrangement of the encapsulating layer ENC may also be modified differently from the above-described embodiment. For example, the first encapsulating inorganic layer TFE1 may cover the first dam DAM1, the second dam DAM2, and the crack dam CRD in the non-display area NDA on the side of the display panel 100. The first encapsulating inorganic layer TFE1 may extend from the non-display area NDA under the display panel 100 to the edge EG of the display panel 100.

The encapsulating organic layer TFE2 may cover the top surface of the first dam DAM1 while not covering the top surface of the second dam DAM2. However, the present disclosure is not limited thereto. The encapsulating organic layer TFE2 might not cover both the top surface of the first dam DAM1 and the top surface of the second dam DAM2. The encapsulating organic layer TFE2 might not overflow to the edge EG of the display panel 100 due to the first dam DAM1 and the second dam DAM2.

The second encapsulating inorganic layer TFE3 may cover the first dam DAM1, the second dam DAM2, and the crack dam CRD in the non-display area NDA on the side of the display panel 100. The second encapsulating inorganic layer TFE3 may extend from the non-display area NDA on the side of the display panel 100 to the edge EG of the display panel 100.

The inorganic encapsulating area in which the first encapsulating inorganic layer TFE1 and the second encapsulating inorganic layer TFE3 contact each other may be formed from the second dam DAM2 to the edge EG of the display panel 100. The inorganic encapsulating area may surround the second dam DAM2 (e.g., in plan view). The display panel 100 further includes the crack dam CRD having an encapsulating layer ENC extending to the edge EG and located at the outer part, so that reliability may be secured in an area in which the inorganic layer is directly located on the substrate SUB in the display panel 100.

In addition, FIG. 34 shows the scan thin film transistor STFT of the scan driving circuit unit SDC. Because the scan thin film transistor STFT is substantially the same as the thin film transistor TFT described with reference to FIG. 6, a description of the scan thin film transistor STFT will be omitted.

As the encapsulating layer ENC extends to the edge EG of the display panel 100, a distance D3 between the crack dam CRD and the edge EG or a distance between the crack dam CRD and the edge area EGA may be defined in the display panel 100. In one or more embodiments, the distance D3 between the crack dam CRD and the edge EG is about 130 μm or less, and the distance between the crack dam CRD and the edge region EGA is about 80 μm or less in the display panel 100.

When the substrate SUB is cut by spraying the etchant after laser irradiation, the minimum distance from the display pad PD to the edge of the substrate SUB may vary depending on the one-side tolerance of the laser. In this case, the minimum distance D3 from the crack dam CRD, which is the outermost structure, to the edge EG of the display panel 100 may be the sum of the width of the edge area EGA, the minimum distance from the crack dam CRD to the edge area EGA, and the unilateral tolerance of the laser. For example, if the minimum distance between the crack dam CRD and the edge area EGA is designed to be approximately 30 μm or less, the minimum distance between the crack dam CRD and the edge area EGA may be at most 80 μm or less due to the tolerance of 50 μm on one side of the laser. However, the minimum distance between the crack dam CRD and the edge area EGA may be about 0 μm in one or more embodiments.

Similarly, when the minimum distance between the crack dam CRD and the edge area EGA is designed to be about 30 μm or less and the width of the edge area EGA is designed to be about 50 μm, the minimum distance D3 between the crack dam CRD and the edge EG may be at most about 130 μm or less due to the tolerance of about 50 μm on one side of the laser.

Similar to the distance D1 between the encapsulating layer ENC and the edge EG of the display panel 100, the minimum distance from the crack dam CRD, which is the outermost structure, to the edge EG of the display panel 100 may vary depending on the width of the edge area EGA and the minimum distance from the crack dam CRD to the edge area EGA.

When the substrate SUB is cut by spraying the etchant after laser irradiation, the minimum distance from the display pad PD to the edge of the substrate SUB may vary depending on the one-side tolerance of the laser. For example, when the laser unilateral tolerance is about 50 μm, the distance D3 between the crack dam CRD and the edge EG may be about 0 μm or less at the minimum or about 130 μm or less at the maximum.

Meanwhile, in one or more embodiments, the display device 10 may further include a heat dissipation layer overlapping the crack dam CRD. The heat dissipation layer may be located at the outer area of the display panel 100 and may be located inside the edge area EGA to overlap the crack dam CRD. In the manufacturing process of the display device 10, the heat dissipation layer dissipates heat generated by the laser irradiated to the cutting process of the mother substrate MSUB, or may reduce or minimize the effect of the laser on the display panel 100 in the cutting process by increasing the infrared absorption rate. For example, the heat dissipation layer may include a metal material having high thermal conductivity or a material having high infrared absorption. The heat dissipation layer may be formed as a single layer or multiple layers made of any one of molybdenum (Mo), aluminum (Al), chromium (Cr), gold (Au), titanium (Ti), nickel (Ni), neodymium (Nd) and/or copper (Cu) or an alloy thereof. The width of the heat dissipation layer may be greater than the width of the edge area EGA. For example, the width of the heat dissipation layer may be about 50 μm or more and about 300 μm or less. However, the present disclosure is not limited thereto.

In concluding the detailed description, those skilled in the art will appreciate that many variations and modifications can be made to the disclosed embodiments without substantially departing from the aspects of the present disclosure. Therefore, the disclosed embodiments of the present disclosure are used in a generic and descriptive sense only and not for purposes of limitation.

What is claimed is:

1. A display device comprising:
a substrate having a display area, and a non-display area surrounding the display area, and comprising:
an edge;
an upper surface having an edge area in which a processing trace remains adjacent to the edge;
a bottom surface opposite to the upper surface;
a side surface connected to the upper surface and not parallel thereto; and
a first inclined surface connected to the side surface and to the bottom surface and not parallel thereto;
a light-emitting element layer above the upper surface of the substrate in the display area, and comprising light-emitting elements;
an encapsulating layer above the light-emitting element layer and corresponding to a portion of the display area and the non-display area; and
a protective layer above an outer surface of the substrate, and located on at least one of the side surface or the first inclined surface.

2. The display device of claim 1, wherein the protective layer comprises inorganic polysilazane or organic polysilazane.

3. A display device comprising:

a substrate having a display area, and a non-display area surrounding the display area, and comprising:

an edge;

an upper surface having an edge area in which a processing trace remains adjacent to the edge;

a bottom surface opposite to the upper surface;

a side surface connected to the upper surface and not parallel thereto; and a first inclined surface connected to the side surface and to the bottom surface and not parallel thereto;

a light-emitting element layer above the upper surface of the substrate in the display area, and comprising light-emitting elements;

an encapsulating layer above the light-emitting element layer and corresponding to a portion of the display area and the non-display area; and a protective layer above an outer surface of the substrate, located on at least one of the bottom surface, the side surface, or the first inclined surface, and comprising a first protective layer on the bottom surface of the substrate, and a second protective layer on the first inclined surface of the substrate.

4. The display device of claim 3, wherein the protective layer further comprises a third protective layer on the side surface of the substrate.

5. The display device of claim 3, wherein the second protective layer extends to the side surface of the substrate.

6. The display device of claim 5, wherein a portion of the second protective layer is above the upper surface of the substrate to cover the edge area.

7. The display device of claim 1, further comprising an encapsulating substrate above the encapsulating layer, wherein the protective layer covers the side surface of the substrate and a side surface of the encapsulating substrate.

8. The display device of claim 7, further comprising a sealing material between the encapsulating substrate and the substrate.

9. The display device of claim 1, further comprising a crack dam in the non-display area above the substrate, and surrounding the display area.

10. The display device of claim 9, wherein the encapsulating layer covers the crack dam, and extends to the edge area of the substrate, wherein a distance between the crack dam and the edge is about 130 μm or less.

11. The display device of claim 1, further comprising a first dam in the non-display area and surrounding the light-emitting element layer in plan view, and a second dam surrounding the first dam in plan view, and located closer to the edge of the substrate than the first dam, wherein the encapsulating layer covers the first dam and the second dam, and wherein a portion of the encapsulating layer is between the second dam and the edge of the substrate.

12. The display device of claim 11, wherein a distance between the edge of the substrate and the encapsulating layer is about 300 μm or less.

13. The display device of claim 1, wherein the first inclined surface overlaps the edge area in a thickness direction, and wherein a width of the edge area is about 50 μm.

14. The display device of claim 1, wherein an angle between the upper surface and the side surface of the substrate is about 90°, and wherein an angle between the side surface and the first inclined surface, and an angle between the first inclined surface and the bottom surface are respective obtuse angles.

15. A method for manufacturing a display device, the method comprising:

preparing a mother substrate;

forming display cells above one surface of the mother substrate;

forming a cutting line along a periphery of the display cell, and forming a processing mark on the one surface of the mother substrate, by irradiating a laser from another surface of the mother substrate that is opposite to the one surface of the mother substrate;

separating a substrate on which the display cells are formed by etching the mother substrate along the cutting line; and forming a protective layer on at least one of a bottom surface of the separated substrate, a side surface of the separated substrate, or a first inclined surface of the separated substrate that is connected to, and not parallel to, the bottom surface and the side surface, the protective layer comprising inorganic polysilazane or organic polysilazane.

16. The method of claim 15, wherein forming the protective layer comprises spraying an uncured silazane material onto the bottom surface, the side surface, and the first inclined surface of the substrate, and curing the silazane material.

17. The method of claim 16, wherein forming the protective layer comprises stacking one or more of substrates, and applying the silazane material on at least one of the side surface and the first inclined surface.

18. The method of claim 15, wherein the laser is irradiated from the one surface of the mother substrate to a first depth of about 50 μm to about 500 μm.

19. The method of claim 15, wherein etching the mother substrate comprises:

reducing a thickness of the mother substrate by isotropically etching the other surface of the mother substrate, and separating the substrate by anisotropically etching the cut line and areas other than the cut line irradiated with the laser on the mother substrate.

20. The method of claim 15, wherein the first inclined surface overlaps an edge area on which the processing mark is formed in a thickness direction, and wherein a width of the edge area is about 50 μm.

* * * * *